(12) United States Patent
Shirakawa

(10) Patent No.: US 11,658,179 B2
(45) Date of Patent: May 23, 2023

(54) SEMICONDUCTOR DEVICE WITH INSULATED-GATE BIPOLAR TRANSISTOR REGION AND DIODE REGION

(71) Applicant: FUJI ELECTRIC CO., LTD., Kawasaki (JP)

(72) Inventor: Tohru Shirakawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/107,672

(22) Filed: Nov. 30, 2020

(65) Prior Publication Data
US 2021/0082912 A1 Mar. 18, 2021

Related U.S. Application Data

(63) Continuation of application No. PCT/JP2019/043167, filed on Nov. 1, 2019.

(30) Foreign Application Priority Data

Dec. 19, 2018 (JP) .............................. JP2018-237396

(51) Int. Cl.
*H01L 21/768* (2006.01)
*H01L 23/522* (2006.01)
(Continued)

(52) U.S. Cl.
CPC ...... *H01L 27/0738* (2013.01); *H01L 27/0248* (2013.01); *H01L 29/0696* (2013.01); *H01L 29/4236* (2013.01); *H01L 29/7397* (2013.01)

(58) Field of Classification Search
CPC ............. H01L 27/0738; H01L 27/0248; H01L 29/0696; H01L 29/4236; H01L 29/7397;
(Continued)

(56) References Cited

U.S. PATENT DOCUMENTS

2002/0113274 A1* 8/2002 Iwagami ................ H03K 17/74
257/213
2003/0047778 A1 3/2003 Nakamura et al.
(Continued)

FOREIGN PATENT DOCUMENTS

CN 102165693 A * 8/2011 ......... H01L 29/7806
JP 08316472 A * 11/1996
(Continued)

OTHER PUBLICATIONS

International Search Report for PCT/JP2019/043167, dated Jan. 28, 2020.
(Continued)

*Primary Examiner* — Marcos D. Pizarro
*Assistant Examiner* — Tenley H Schofield
(74) *Attorney, Agent, or Firm* — Rabin & Berdo, P.C.

(57) ABSTRACT

An active region has first and second cell regions respectively disposed in a main IGBT and a sensing IGBT. The second cell region has a detecting region in which the sensing IGBT is disposed and an extracting region that surrounds a periphery of the detecting region. A resistance region containing polysilicon and connected to the sensing IGBT is provided on the semiconductor substrate, in the extracting region. The resistance region connected to the sensing IGBT has a first portion connected to the gate electrodes of the sensing IGBT and a second portion connecting the first portion to the gate runner, and configures a built-in resistance of the second portion having a resistance value in a range from 10Ω to 5000Ω. As a result, a trade-off relationship between enhancing ESD tolerance of a current sensing region that includes the sensing IGBT and reducing transient sensing voltage may be improved.

10 Claims, 33 Drawing Sheets

(51) Int. Cl.
*H01L 27/07* (2006.01)
*H01L 27/02* (2006.01)
*H01L 29/06* (2006.01)
*H01L 29/423* (2006.01)
*H01L 29/739* (2006.01)

(58) Field of Classification Search
CPC ............. H01L 29/1608; H01L 29/1095; H01L 29/7813; H01L 23/3171; H01L 23/4824; H01L 23/3192; H01L 29/0623; H01L 29/0619; H01L 29/66068; H01L 29/7802; H01L 29/0878; H01L 2224/0603; H01L 29/16

See application file for complete search history.

(56) References Cited

U.S. PATENT DOCUMENTS

| | | | |
|---|---|---|---|
| 2005/0151187 A1* | 7/2005 | Wakimoto | H01L 29/7397 257/330 |
| 2005/0162798 A1* | 7/2005 | Kato | H03K 17/0828 361/111 |
| 2008/0230810 A1 | 9/2008 | Yoshimura | |
| 2009/0014754 A1* | 1/2009 | Yoshikawa | H01L 29/7397 257/E29.198 |
| 2010/0001785 A1* | 1/2010 | Baginski | H01L 23/34 327/513 |
| 2015/0270387 A1 | 9/2015 | Kumada | |
| 2015/0303294 A1* | 10/2015 | Sakata | H01L 29/0869 257/329 |
| 2017/0111037 A1* | 4/2017 | Shiigi | H01L 29/1608 |
| 2018/0114788 A1* | 4/2018 | Ahlers | H01L 27/0288 |
| 2018/0240792 A1 | 8/2018 | Senoo et al. | |
| 2018/0269296 A1* | 9/2018 | Weyers | H01L 29/7802 |
| 2018/0337171 A1* | 11/2018 | Losee | H01L 29/1608 |

FOREIGN PATENT DOCUMENTS

| | | | | |
|---|---|---|---|---|
| JP | 2005209943 A | | 8/2005 | |
| JP | 2008235788 A | | 10/2008 | |
| JP | 5025071 B2 | | 9/2012 | |
| JP | 2015179705 A | | 10/2015 | |
| JP | 2017079324 A | * | 4/2017 | ......... H01L 29/7804 |
| JP | 2018137391 A | | 8/2018 | |

OTHER PUBLICATIONS

Written Opinion of the International Searching Authority for PCT/JP2019/043167, dated Jan. 28, 2020.

* cited by examiner

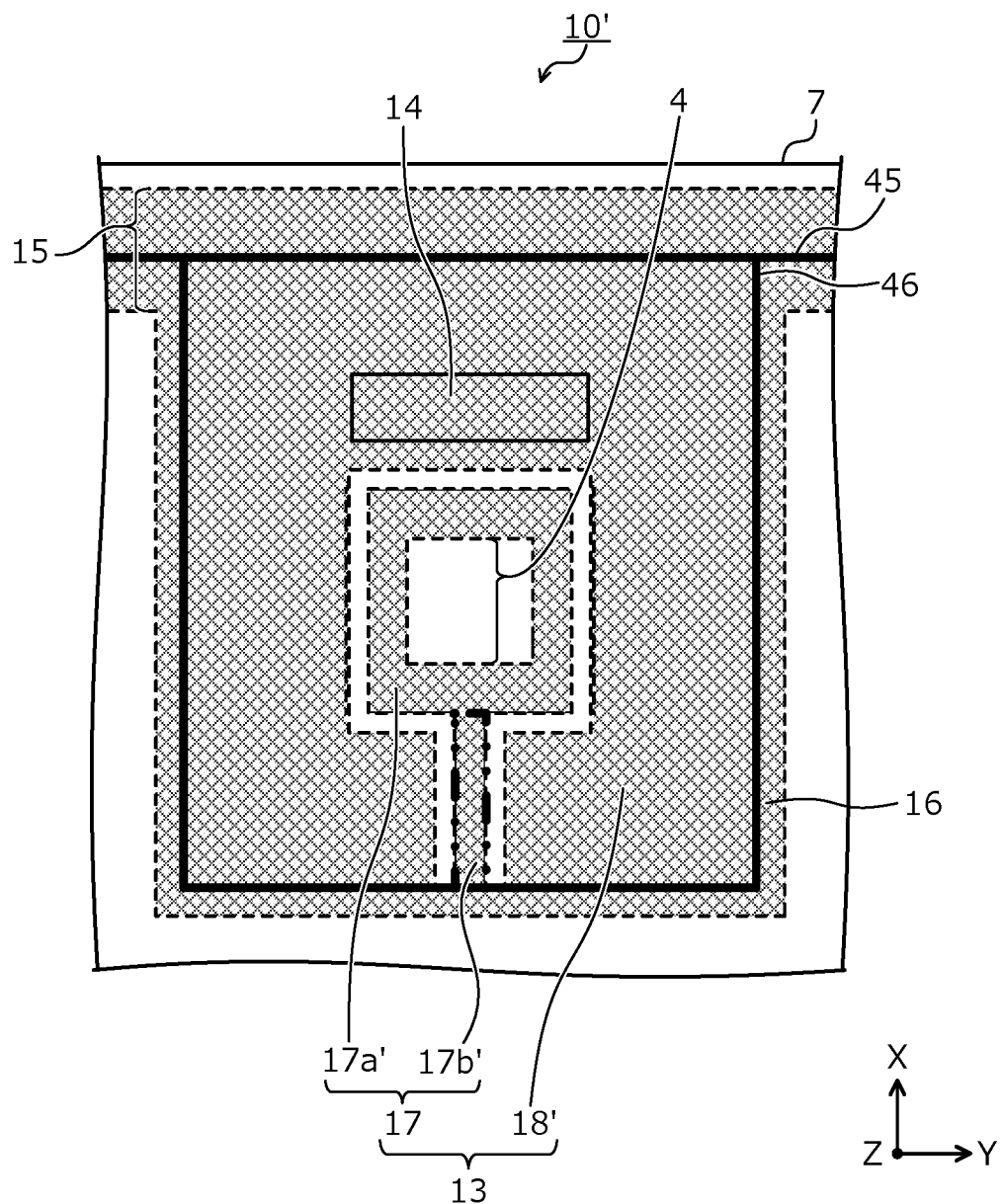

FIG.16
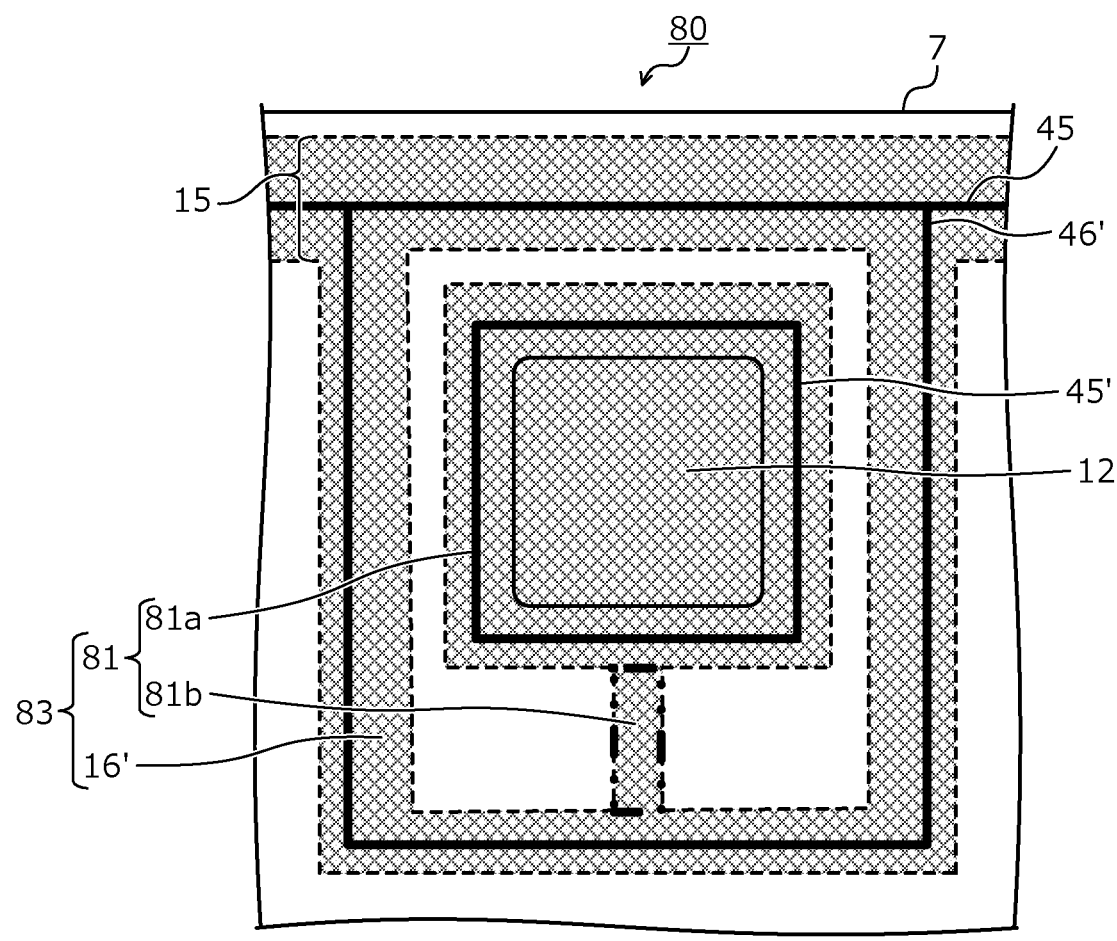
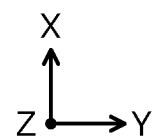

SEMICONDUCTOR DEVICE WITH INSULATED-GATE BIPOLAR TRANSISTOR REGION AND DIODE REGION

CROSS REFERENCE TO RELATED APPLICATIONS

This is a continuation application of International Application PCT/JP2019/043167 filed on Nov. 1, 2019 which claims priority from a Japanese Patent Application No. 2018-237396 filed on Dec. 19, 2018, the contents of which are incorporated herein by reference.

BACKGROUND OF THE INVENTION

1. Field of the Invention

Embodiments of the invention relate to a semiconductor device.

2. Description of the Related Art

Conventionally, in IPMs (intelligent power modules), on a single semiconductor substrate having an IGBT (insulated gate bipolar transistor, hereinafter, main IGBT) as a main semiconductor element, a circuit region for protecting the main IGBT is provided. As a circuit region for protecting the main IGBT, a current sensing region that detects overcurrent (OC: Over Current) flowing in the main IGBT is commonly provided (for example, refer to Japanese Laid-Open Patent Publication No. 2015-179705).

The current sensing region is an IGBT (hereinafter, sensing IGBT) that includes unit cells (functional units of an element) each having a configuration similar to that of unit cells of the main IGBT, the current sensing region having fewer unit cells than does the main IGBT (for example, one of a few thousandths of the quantity of unit cells of the main IGBT). In a predetermined region of the semiconductor substrate that has the main IGBT, the sensing IGBT is disposed connected in parallel to the main IGBT. When the main IGBT is ON, collector-emitter current passing through the sensing IGBT is determined by a ratio of the number of unit cells of the sensing IGBT to the number of unit cells of the main IGBT and thus, the amount of the current is smaller than that of the collector-emitter current passing through the main IGBT.

The collector-emitter current passing through the sensing IGBT is detected by a control IC (integrated circuit) connected to a main electrode of the sensing IGBT via a wire. The control IC determines whether overcurrent is flowing between the collector and emitter of the main IGBT, based on the amount of the collector-emitter current passing through the sensing IGBT. The control IC has an overcurrent protection function of blocking the collector-emitter current of the main IGBT by turning OFF gates of the main IGBT and suspending operation of the main IGBT when overcurrent flows between the collector and emitter of the main IGBT.

A structure of a conventional semiconductor device is described. FIG. 28 is a plan view of a layout of the conventional semiconductor device viewed from a front surface of a semiconductor substrate. FIGS. 29 and 30 are enlarged plan views near the current sensing region in FIG. 28. In FIGS. 28 to 30, a contact hole 145 of a gate runner metal and a gate runner 115, and a contact hole 146 of an extended portion of the gate runner metal and an extended portion 116 of the gate runner 115 are depicted by a thick line.

Further, in FIGS. 28 to 30, the gate runner metal and the extended portion of the gate runner metal are not depicted. FIGS. 29 and 30 depict the same region in FIG. 28, however, hatched portions in each differ. In FIGS. 28 and 29, $p^+$-type isolating regions 141, 142 are indicated by hatching. In FIG. 30, a sensing polysilicon layer 113 containing polysilicon (poly-Si) and the gate runner 115 are indicated by hatching. FIG. 31 is a cross-section view of the structure along cutting line AA-AA' in FIGS. 29 and 30.

A conventional semiconductor device 110 depicted in FIGS. 28 to 31 includes a main IGBT 120 and a sensing IGBT 130 as a current sensing region that detects current flowing in the main IGBT 120, on a semiconductor substrate (semiconductor chip) 107. The main IGBT 120 and the sensing IGBT 130 are trench gate type IGBTs having a same structure. An active region 101 having first and second cell regions 102, 103 and an edge termination region 106 that surrounds a periphery of the active region 101 are provided on the semiconductor substrate 107.

In the first cell region 102, a $p^+$-type region (hereinafter, $p^+$-type isolating region) 141 is disposed in the semiconductor substrate 107 so as to surround a periphery of the first cell region 102. In the first cell region 102, in a region thereof surrounded by the $p^+$-type isolating region 141, unit cells of the main IGBT 120 are disposed. The first cell region 102 is isolated from regions other than the first cell region 102 by a pn junction between the $p^+$-type isolating region 141 and an $n^-$-type drift region 121. The first cell region 102 is a portion of the active region 101, excluding the second cell region 103 and occupies a majority of the surface area of the active region 101.

Further, in the first cell region 102, an emitter electrode 151 of the main IGBT 120 is provided on a front surface of the semiconductor substrate 107. The emitter electrode 151 of the main IGBT 120 covers substantially an entire area of the first cell region 102. An emitter pad 111 is configured by a portion of the emitter electrode 151. Near a border between the first cell region 102 and the edge termination region 106, a gate pad 112 is disposed. The gate pad 112 is connected to the gate runner 115. Unit cells of the sensing IGBT 130 are disposed in the second cell region 103.

The second cell region 103 has a detecting region 104 in which the unit cells of the sensing IGBT 130 are disposed and an extracting region 105 for pulling out hole current. In the extracting region 105, the $p^+$-type isolating regions 141, 142 are each selectively provided in the semiconductor substrate 107. The $p^+$-type isolating region 141 surrounds a periphery of the detecting region 104. The $p^+$-type isolating region 142 is disposed between the $p^+$-type isolating region 141 and the detecting region 104, separate from the $p^+$-type isolating region 141, and surrounds a periphery of the detecting region 104. The detecting region 104 of the second cell region 103 is isolated from regions other than the detecting region 104 by a pn junction between the $p^+$-type isolating region 142 and the $n^-$-type drift region 121.

In the extracting region 105, the sensing polysilicon layer 113 is disposed on the front surface of the semiconductor substrate 107 via a field oxide film 143. The sensing polysilicon layer 113 surrounds a periphery of the detecting region 104. The sensing polysilicon layer 113 serves as the extended portion 116 of the gate runner 115 described hereinafter. Capacitance configured by the sensing polysilicon layer 113, the interlayer insulating film 144, and the emitter electrode 152 of the sensing IGBT 130 is a portion of a gate-emitter capacitance CGE of the sensing IGBT 130. The emitter electrode 152 of the sensing IGBT 130 is provided spanning substantially an entire area of the second cell region 103 and extends on the sensing polysilicon layer 113 with the interlayer insulating film 144 intervening therebetween.

A sensing emitter pad 114 configured by a portion of the emitter electrode 152 is disposed in the extracting region 105. The gate runner 115 containing polysilicon is disposed in the edge termination region 106 and surrounds a periphery of the active region 101. Further, the gate runner 115 has a portion (hereinafter, extended portion) 116 that extends to the second cell region 103, along an outer periphery of the second cell region 103. The extended portion 116 of the gate runner 115 surrounds a periphery of the second cell region 103. A single polysilicon layer formed by the gate runner 115 and the extended portion 116 of the gate runner 115 extends along an outer periphery of the first cell region 102 and surrounds a periphery of the first cell region 102.

In FIGS. 29 and 30, an inner periphery (edges closest to the detecting region 104) of the sensing polysilicon layer 113 is indicated by a dashed line and reference character 113*a*. An inner periphery (edges closest to the active region 101) of the gate runner 115, the inner periphery surrounding a periphery of the active region 101, and an outer periphery (edges closest to ends of the semiconductor substrate 107) of the gate runner 115 are indicated by dashed lines and reference characters 115*a*, 115*b*, respectively. Edges of the extended portion 116 of the gate runner 115, the edges in the active region 10 are indicated by reference character 116*a*. The sensing polysilicon layer 113 is formed integrally with the gate runner 115 and the extended portion 116 of the gate runner 115. The gate runner 115 is electrically connected to a gate metal runner 153 via the contact hole 146 formed in the interlayer insulating film 14. Gate electrodes 128, 138 of the main IGBT 120 and the sensing IGBT 130 are electrically connected to the gate runner 115.

Further, as a conventional semiconductor device, a trench gate type IGBT has been proposed, the trench gate type IGBT having emitter contact trenches between gate trenches in which gate electrodes are embedded, the emitter contact trenches penetrating an emitter region and a base region and reaching a drift region; and in the trench gate type IGBT, an emitter electrode and semiconductor region are electrically connected via a conductive layer embedded in the emitter contact trenches (for example, refer to Japanese Patent No. 5025071). In Japanese Patent No. 5025071, an effective gate width is smaller than that for a trench gate type IGBT without emitter contact trenches, whereby the amount of the collector-emitter current of the IGBT is small and saturation current is controlled.

SUMMARY OF THE INVENTION

According to an embodiment of the invention, a semiconductor device includes a semiconductor substrate; an active region provided on the semiconductor substrate; and a termination region provided in the semiconductor substrate, surrounding a periphery of the active region. The active region includes: a first cell region in which a first insulated-gate-type bipolar transistor is disposed, and a second cell region disposed adjacent to the first cell region. The second cell region includes: a first region in which a second insulated-gate-type bipolar transistor is disposed, the second insulated-gate-type bipolar transistor having an arithmetic area smaller than that of the first insulated-gate-type bipolar transistor, and a second region separating the first cell region from the first region. The second region includes: a first gate electrode layer provided on the semiconductor substrate via an oxide film, and an emitter electrode of the second insulated-gate-type bipolar transistor, provided on the first gate electrode layer via an interlayer insulating film. The termination region comprises a gate runner provided on the semiconductor substrate via the oxide film, the gate runner surrounding a periphery of the active region, and being electrically connected to a plurality of first gate electrodes of the first insulated-gate-type bipolar transistor. The first gate electrode layer has: a first gate electrode layer portion electrically connected to a plurality of second gate electrodes of the second insulated-gate-type bipolar transistor, and a second gate electrode layer portion in the second region, having a planar shape in a plane parallel to a surface of the semiconductor substrate and extending from the first gate electrode layer portion to the gate runner, the second gate electrode layer portion electrically connecting the first gate electrode layer portion and the gate runner. The second gate electrode layer portion has a resistance value in a range from 10Ω to 5000Ω.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 9 is a plan view of an example of a layout of a portion of the semiconductor device according to the second embodiment, viewed from the front side of the semiconductor substrate.

FIG. 16 is a plan view of a layout of a portion of a semiconductor device according to a fourth embodiment, viewed from a front side of a semiconductor substrate.

DETAILED DESCRIPTION OF THE INVENTION

First, problems associated with the conventional techniques are discussed. During package assembly for mounting the semiconductor substrate 107 on a base substrate, or during product assembly for incorporating the package into a product, electro-static discharge (ESD) occurs due to contact between or close proximity of conductive objects (between a person and components, or between components). An occupied area of the sensing IGBT 130 is small relative to the arithmetic area of the semiconductor substrate 107 and therefore, the gate-emitter capacitance CGE is extremely small and ESD tolerance is low. Therefore, when gate voltage Vg (for example, about 80V) at least equal to breakdown voltage between the gates and emitters in the sensing IGBT 130 is applied, dielectric breakdown of gate insulating films 137 in gate trenches 136 of the sensing IGBT 130 occurs.

Meanwhile, the gate-emitter capacitance CGE of the sensing IGBT 130 is increased, whereby the ratio of the gate voltage Vg to electric charge Q of the gate insulating films 137 of the sensing IGBT 130 decreases (Q=CGE×Vg), whereby the ESD tolerance of the sensing IGBT 130 may be increased. Nonetheless, when the gate-emitter capacitance CGE of the sensing IGBT 130 is increased, during a switching transition period of the sensing IGBT 130, sensing voltage applied between the collector and emitter of the sensing IGBT 130 transiently increases. Transient increase of the sensing voltage occurs because gate current Ig flowing into gates of the sensing IGBT 130 during the switching transition period of the sensing IGBT 130 is large.

Figure 24:
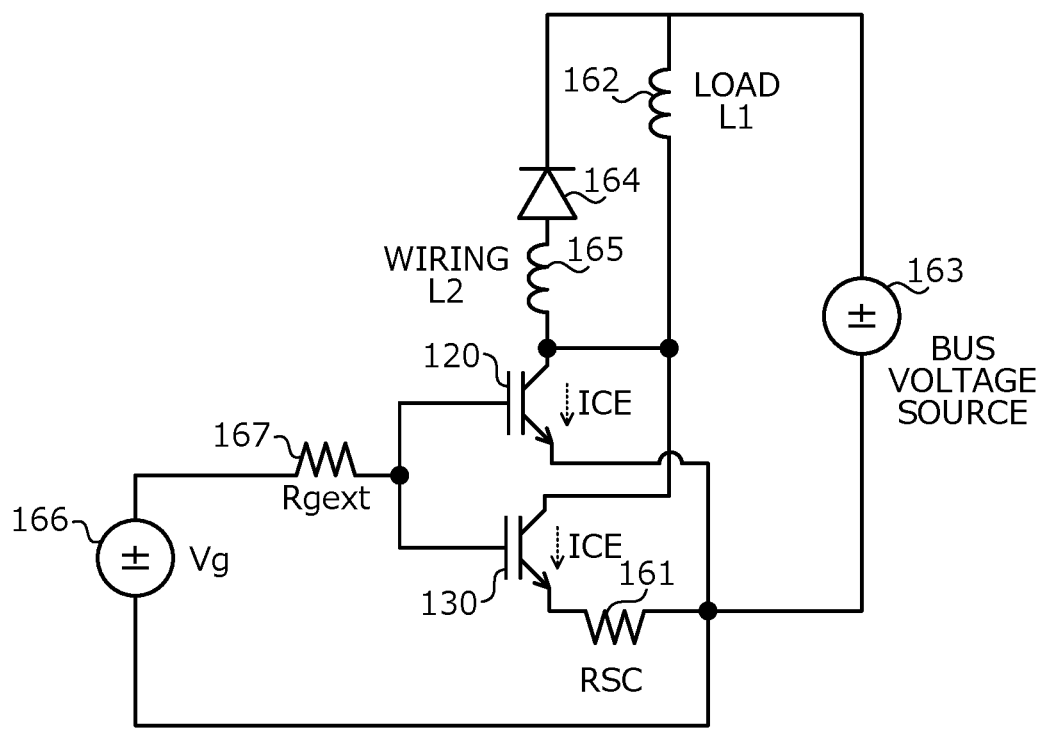
FIG. 24 is an equivalent circuit diagram of a switching circuit.
Figure 25:
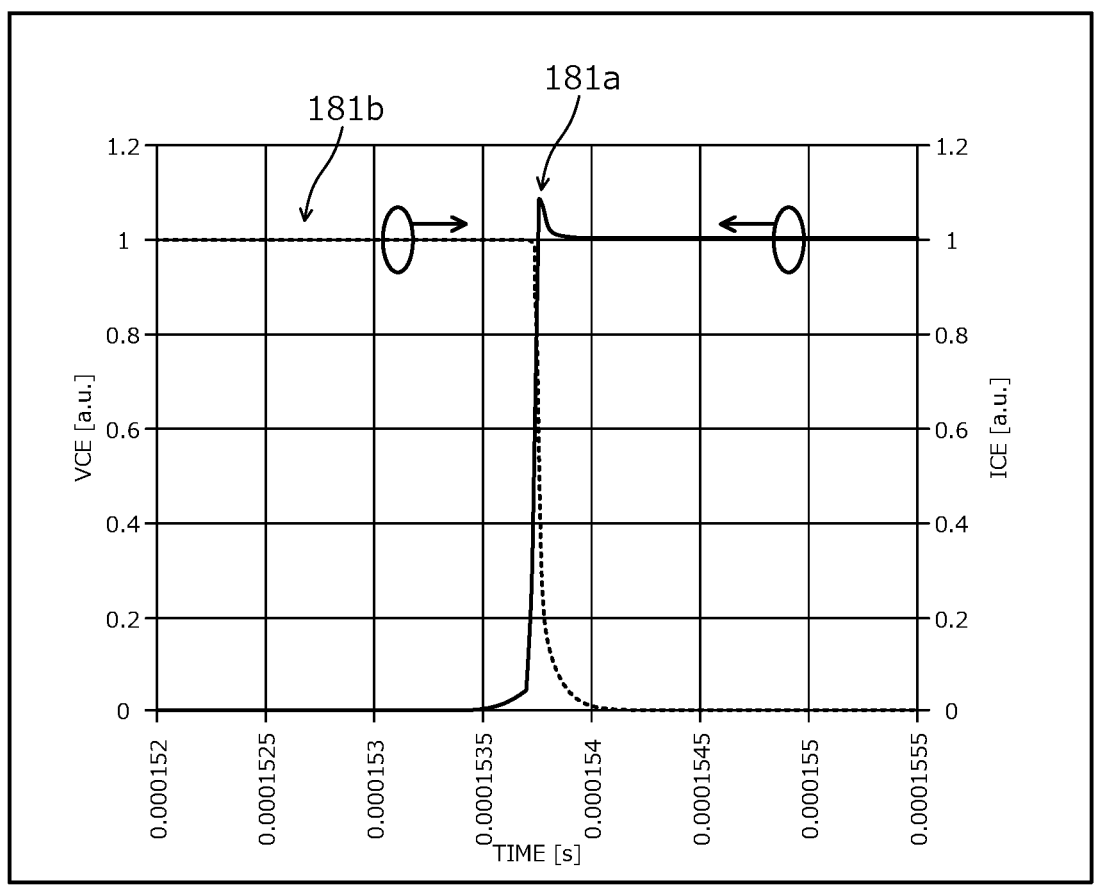
FIG. 25 is a diagram depicting results of simulation of current/voltage waveforms of a conventional semiconductor device.
Figure 26:
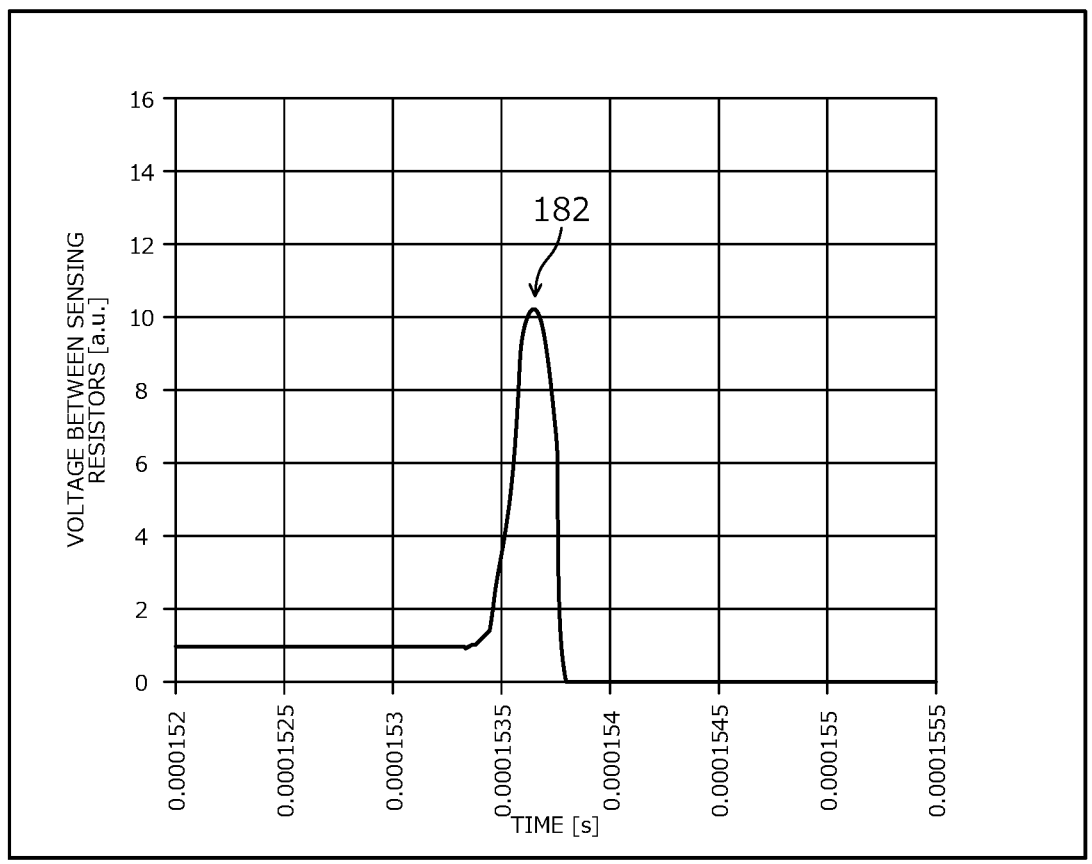
FIG. 26 is a diagram depicting results of simulation of voltage waveforms of sensing voltage applied to a sensing resistor depicted in FIG. 24.

The gate current Ig flowing into the gates of the sensing IGBT 130 is calculated by multiplying the gate-emitter capacitance CGE of the sensing IGBT 130 and dV/dt (voltage change rate per unit time) of gate-emitter voltage (Ig=CGE×dV/dt). FIG. 24 is an equivalent circuit diagram of a switching circuit. FIG. 25 is a diagram depicting results of simulation of current/voltage waveforms of the conventional semiconductor device. FIG. 26 is a diagram depicting results of simulation of voltage waveforms of sensing voltage applied to a sensing resistor depicted in FIG. 24. In FIGS. 25 and 26, a horizontal axis shows a same elapsed time.

The switching circuit depicted in FIG. 24 includes the main IGBT 120 and the sensing IGBT 130 connected in parallel, and a sensing resistor 161. A first end of the sensing resistor 161 is connected to the emitter of the sensing IGBT 130. A second end of the sensing resistor 161 is connected to the emitter of the main IGBT 120. The second end of the sensing resistor 161 is further connected to gates of the sensing IGBT 130 and gates of the main IGBT 120 via a gate voltage source 166.

The collector of the main IGBT 120 and the collector of the sensing IGBT 130 are connected to a positive electrode of a bus voltage source 163 via a load inductance 162 of a load L1. A negative electrode of the bus voltage source 163 is connected to the emitter of the main IGBT 120 and the emitter of the sensing IGBT 130. Between the collector and emitter of the main IGBT 120 and between the collector and emitter of the sensing IGBT 130, a diode 164 is connected in antiparallel to the load inductance 162.

When the main IGBT 120 and the sensing IGBT 130 are OFF, the diode 164 has a function of returning current flowing to the collectors of the IGBTs 120, 130. An inductive load 165 assuming inductance L2 of wiring is connected between the diode 164 and the collector of the main IGBT 120 and between the diode 164 and the collector of the sensing IGBT 130. The gate voltage Vg is applied to the gates of the main IGBT 120 and the sensing IGBT 130, from the gate voltage source 166 via a gate resistor 167. The gate resistor 167 is configured by an external resistor Rgext such as an IC connected to the main IGBT 120 and the sensing IGBT 130 of the semiconductor device.

Current/voltage waveforms during combined turn OFF of the main IGBT 120 and the sensing IGBT 130 simulated using the switching circuit depicted in FIG. 24 are shown in FIG. 25. The sensing IGBT 130 has a configuration similar to that of the main IGBT 120 and therefore, under conditions similar to those of the main IGBT 120, is operated in parallel with the main IGBT 120 (turn ON or turn OFF).

Results of simulation of voltage waveforms of voltage (sensing voltage) VSC applied to the sensing resistor 161 during turn OFF of the main IGBT 120 and the sensing IGBT 130 simulated using the switching circuit depicted in FIG. 24 are depicted in FIG. 26. The sensing voltage VSC applied to the sensing resistor 161 is a potential difference that occurs between ends of the sensing resistor 161, according to a resistance value RSC of the sensing resistor 161, due to collector-emitter current ICE (area indicated by reference character 181b in FIG. 25) of the sensing IGBT 130 flowing through the sensing resistor 161. The sensing voltage VSC applied to the sensing resistor 161 is detected by, for example, an external control IC.

From the results depicted in FIG. 26, is was confirmed that when collector-emitter voltage VCE of the sensing IGBT 130 increases (refer to FIG. 25), the sensing voltage VSC applied to the sensing resistor 161 transiently increases. Transient increase of the sensing voltage VSC applied to the sensing resistor 161 occurs because the gate current Ig of the sensing IGBT 130 increases due to dV/dt (area indicated by reference character 181a in FIG. 25) of the collector-emitter voltage VCE of the sensing IGBT 130. Hereinafter, transiently large sensing voltage VSC is referred to as "transient sensing voltage". An area indicated by reference numeral 182 in FIG. 26 is a peak voltage (maximum value) of the transient sensing voltage. A factor causing the gate current Ig of the sensing IGBT 130 to increase stems from increase of dV/dt of the sensing IGBT 130 and the gate-emitter capacitance CGE of the sensing IGBT 130.

Figure 27:
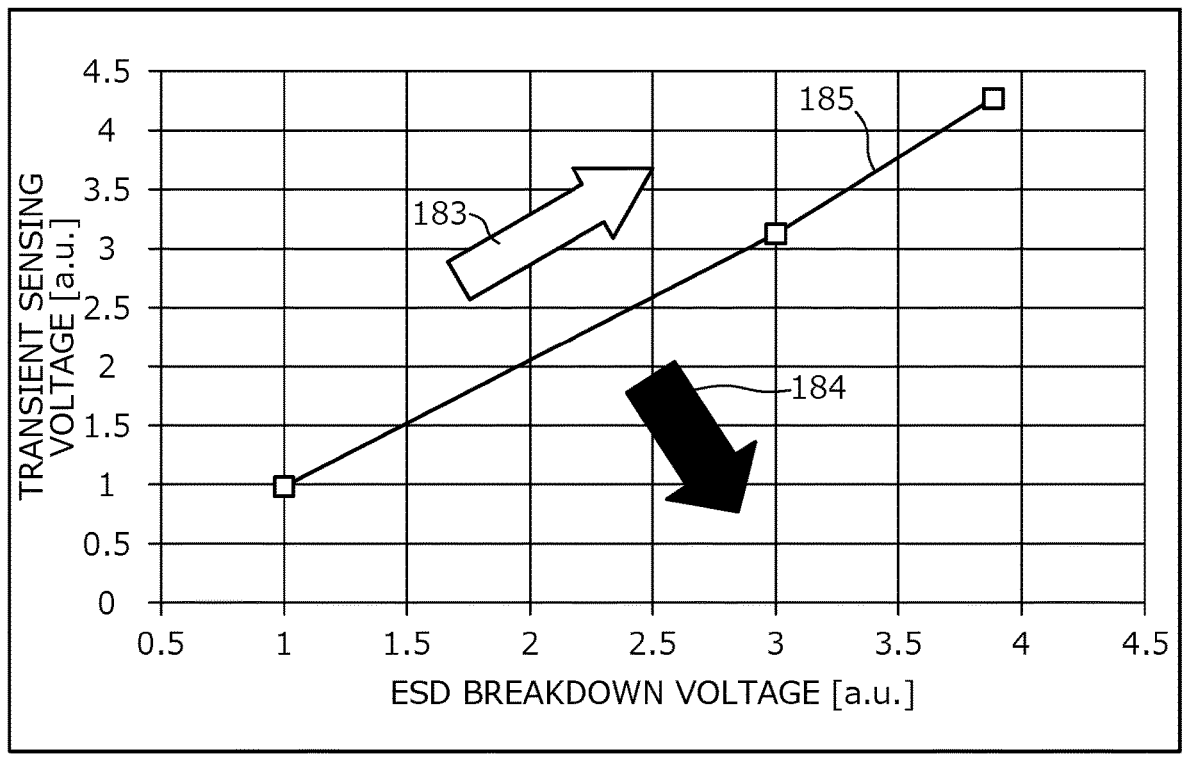
FIG. 27 is a diagram showing measurement results for a relationship between ESD tolerance of the sensing IGBT and transient sensing voltage.
Figure 28:
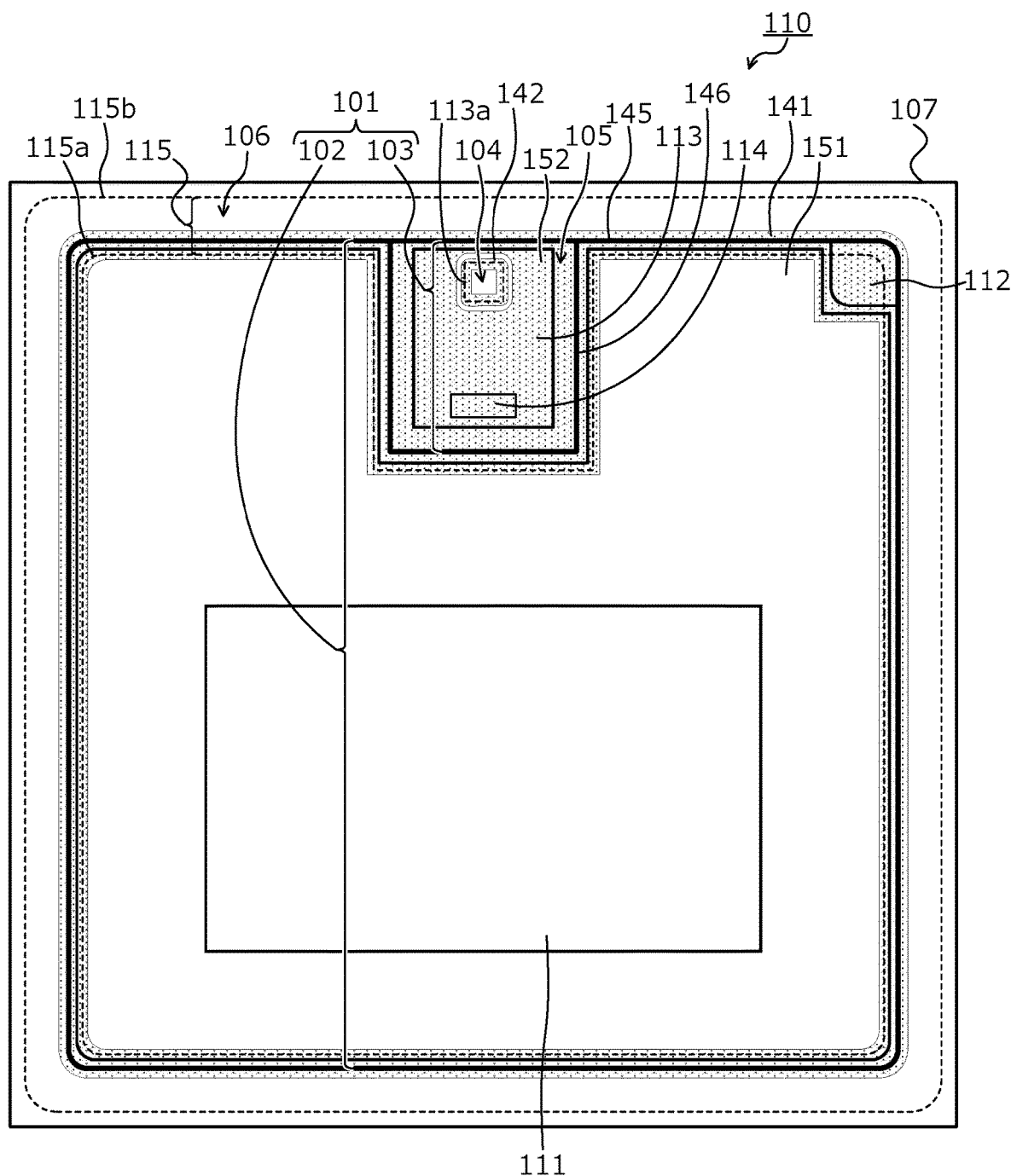
FIG. 28 is a plan view of a layout of a conventional semiconductor device viewed from a front surface of a semiconductor substrate.
Figure 29:
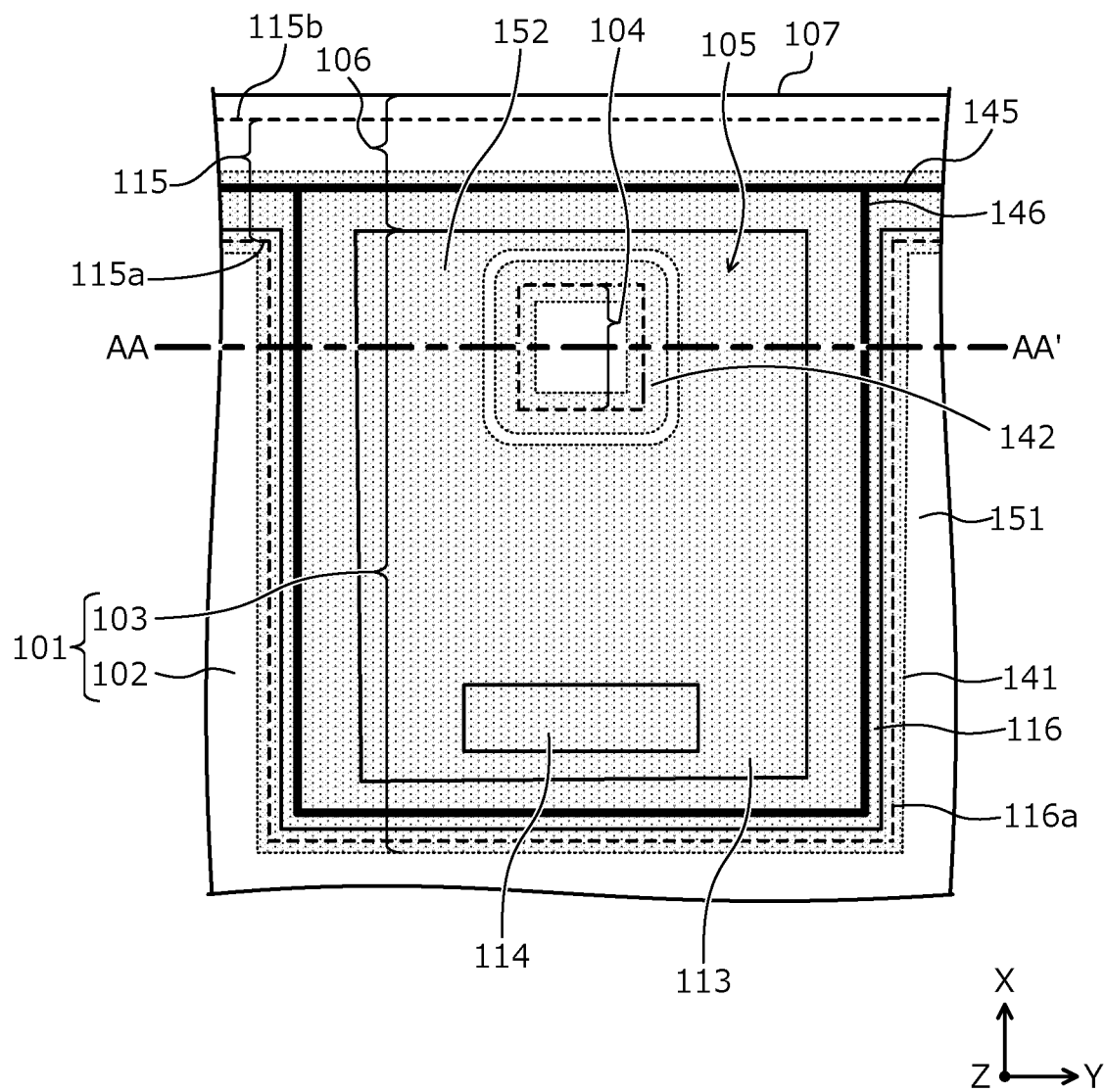
FIG. 29 is an enlarged plan view near a current sensing region in FIG. 28.
Figure 30:
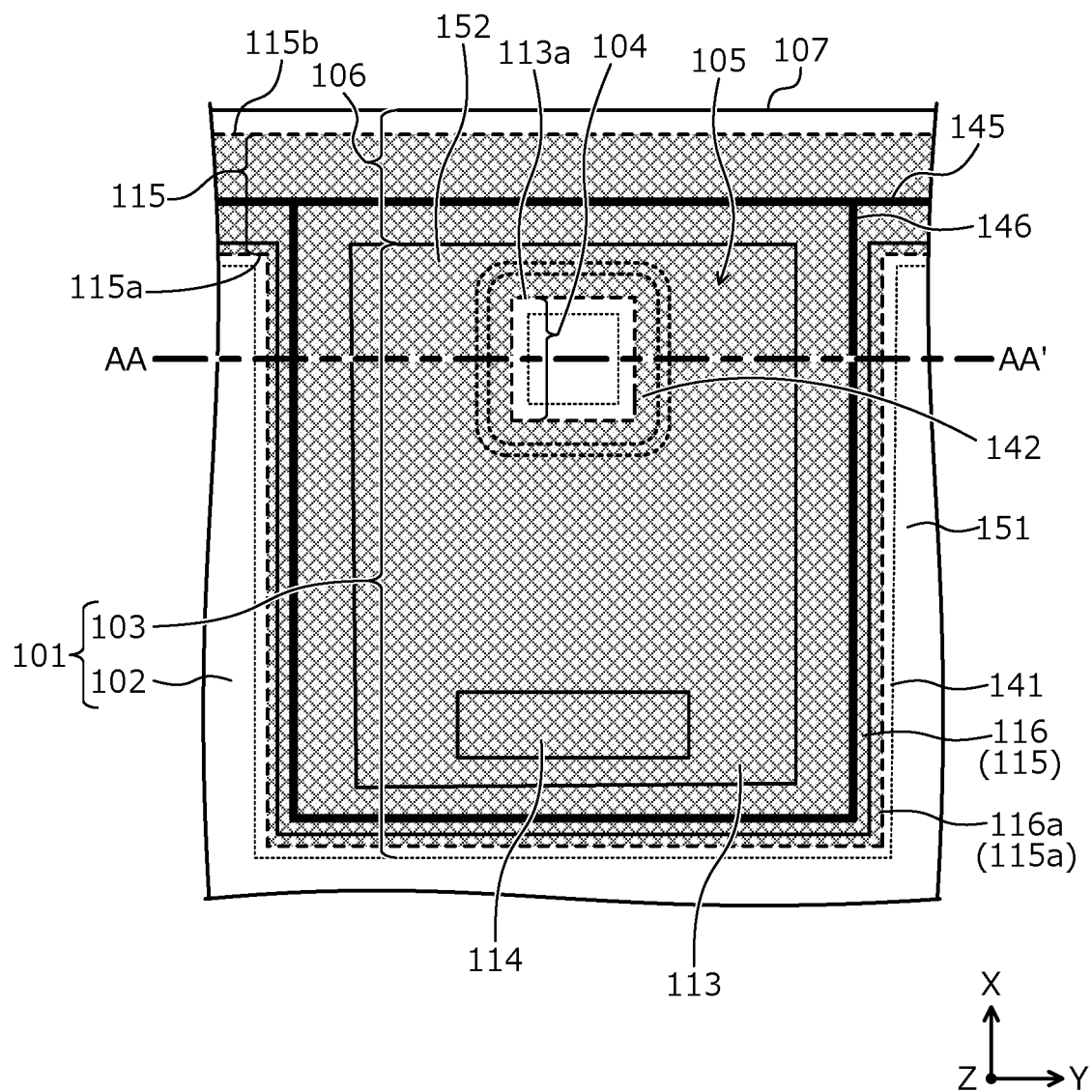
FIG. 30 is an enlarged plan view near the current sensing region in FIG. 28.
Figure 31:
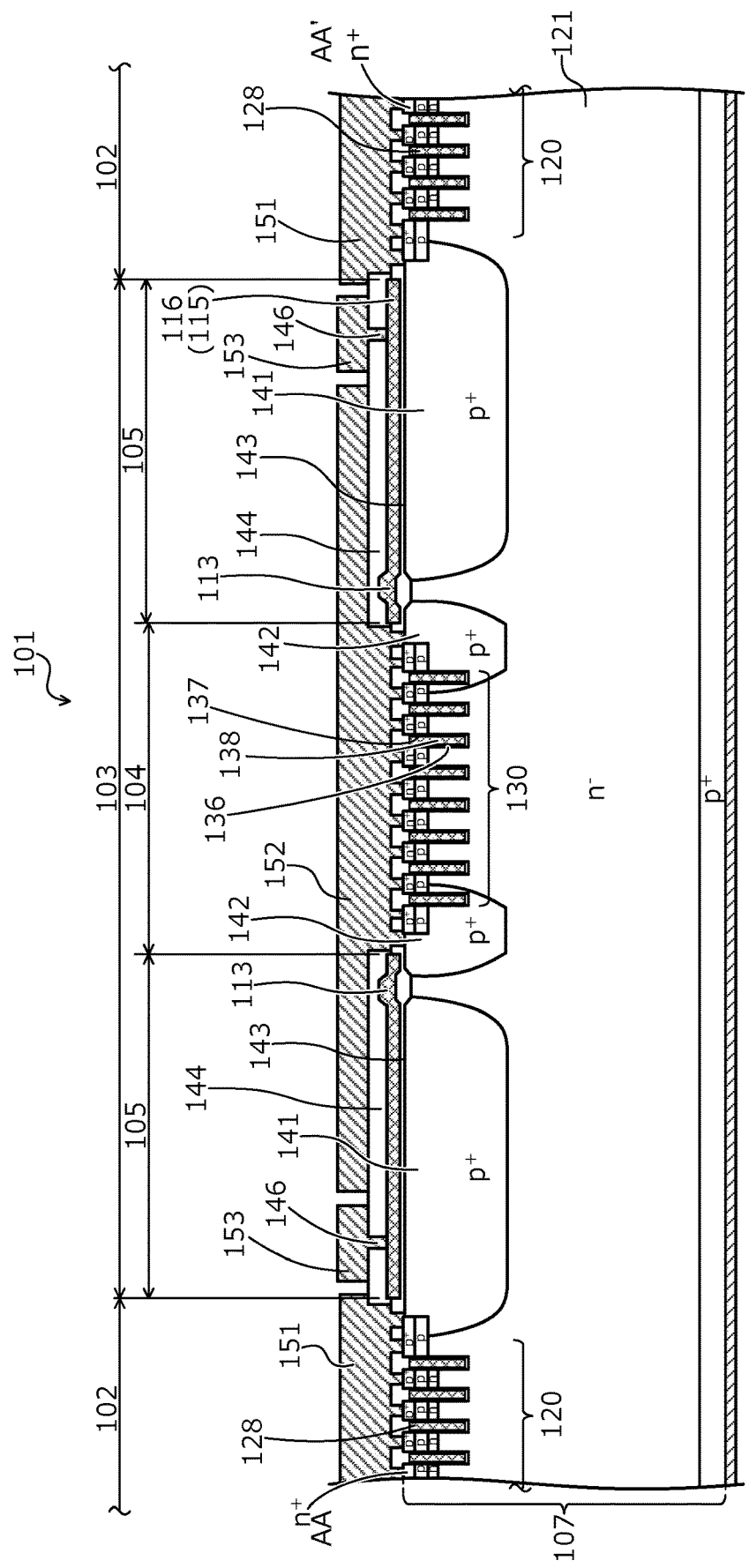
FIG. 31 is a cross-section view of the structure along cutting line AA-AA' in FIGS. 29 and 30.

With respect to this conventional example, a relationship between ESD tolerance of the sensing IGBT 130 and transient sensing voltage was measured. FIG. 27 is a diagram showing measurement results for the relationship between ESD tolerance of the sensing IGBT and transient sensing voltage. Data points in FIG. 27, in a direction from an origin to a terminal point of an arrow 183, indicate that the gate-emitter capacitance CGE of the sensing IGBT 130 is increasing. From the results depicted in FIG. 27, it was confirmed that when the gate-emitter capacitance CGE of the sensing IGBT 130 is increased to ensure ESD tolerance (tolerance against ESD breakdown voltage described hereinafter), during the switching transition period of the sensing IGBT 130, the transient sensing voltage applied between the collector and emitter of the sensing IGBT 130 increases.

In this manner, due to fluctuation of the gate-emitter capacitance CGE of the sensing IGBT 130, enhancement of the ESD tolerance of the sensing IGBT 130 and reduction of the transient sensing voltage have a trade-off relationship. In FIG. 27, an approximation line 185 showing the relationship between transient sensing voltage and ESD tolerance of the sensing IGBT indicates that improvement of the trade-off relationship between enhancing ESD tolerance and reducing transient sensing voltage increases in a direction (downward and to the right) indicated by arrow 184. As described above, in an instance in which the transient sensing voltage increases, even when low current that is at most equal to the rated current passes between the collector and emitter of the main IGBT 120, the overcurrent protection function easily operates due to erroneous operation and operation of the main IGBT 120 may be suspended due to the overcurrent protection function.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical are given the same reference numerals and are not repeatedly described.

Figure 1:
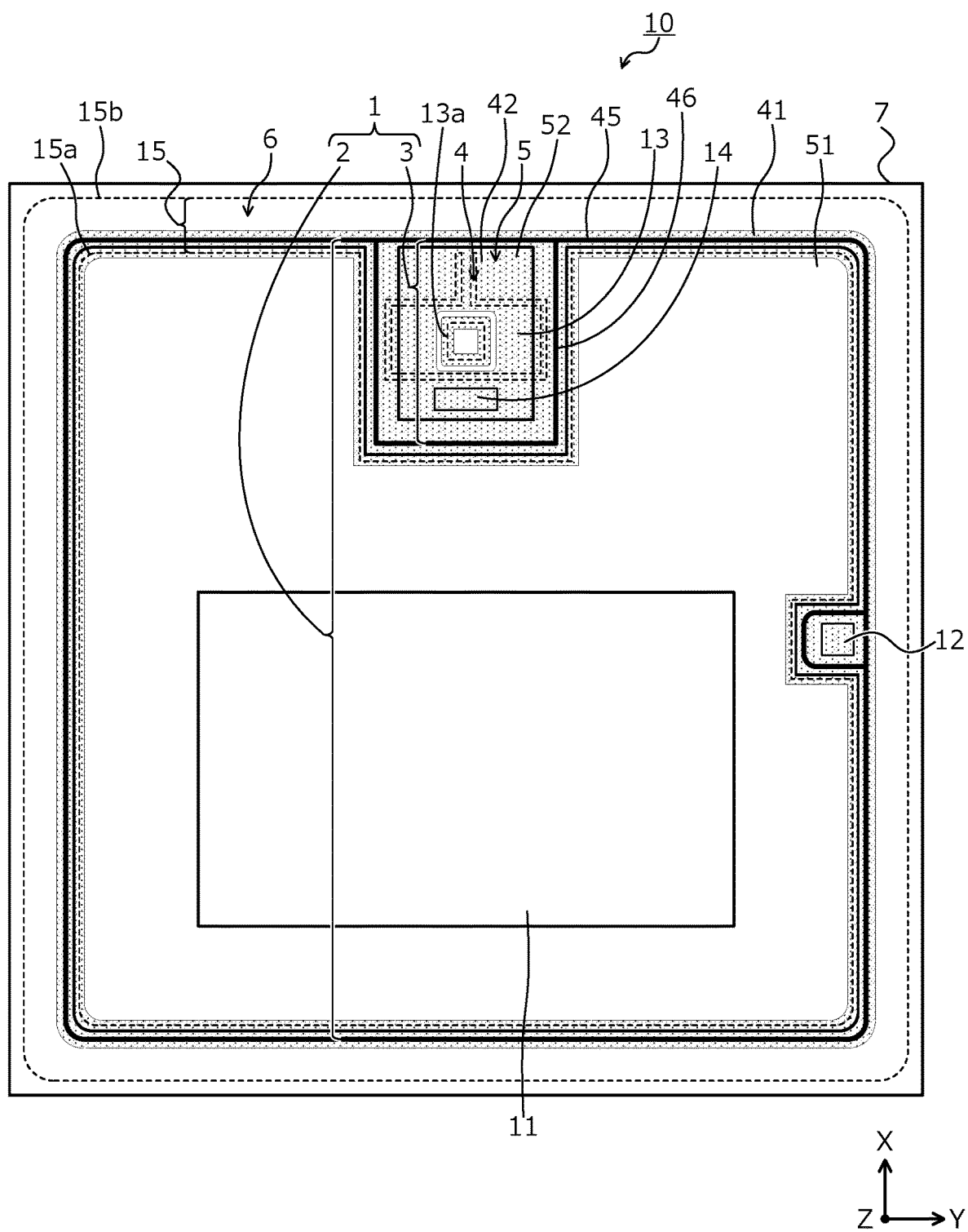
FIG. 1 is a plan view of a layout of a semiconductor device according to a first embodiment, viewed from a front side of a semiconductor substrate.

A structure of a semiconductor device according to a first embodiment is described. FIG. 1 is a plan view of a layout of the semiconductor device according to the first embodiment, viewed from a front side of a semiconductor substrate. FIGS. 2, 3, 4, and 5 are enlarged plan views of a second cell region 3 in FIG. 1. In FIGS. 1 to 5, contact holes 45 of a gate runner metal 53 and a gate runner 15, and contact holes 46 of an extended portion 54 of a gate runner metal 53 and an extended portion 16 of the gate runner 15 are indicated by a bold line. In FIGS. 1 to 4, the gate runner metal 53 and the extended portion 54 of the gate runner metal 53 are not depicted.

Figure 2:
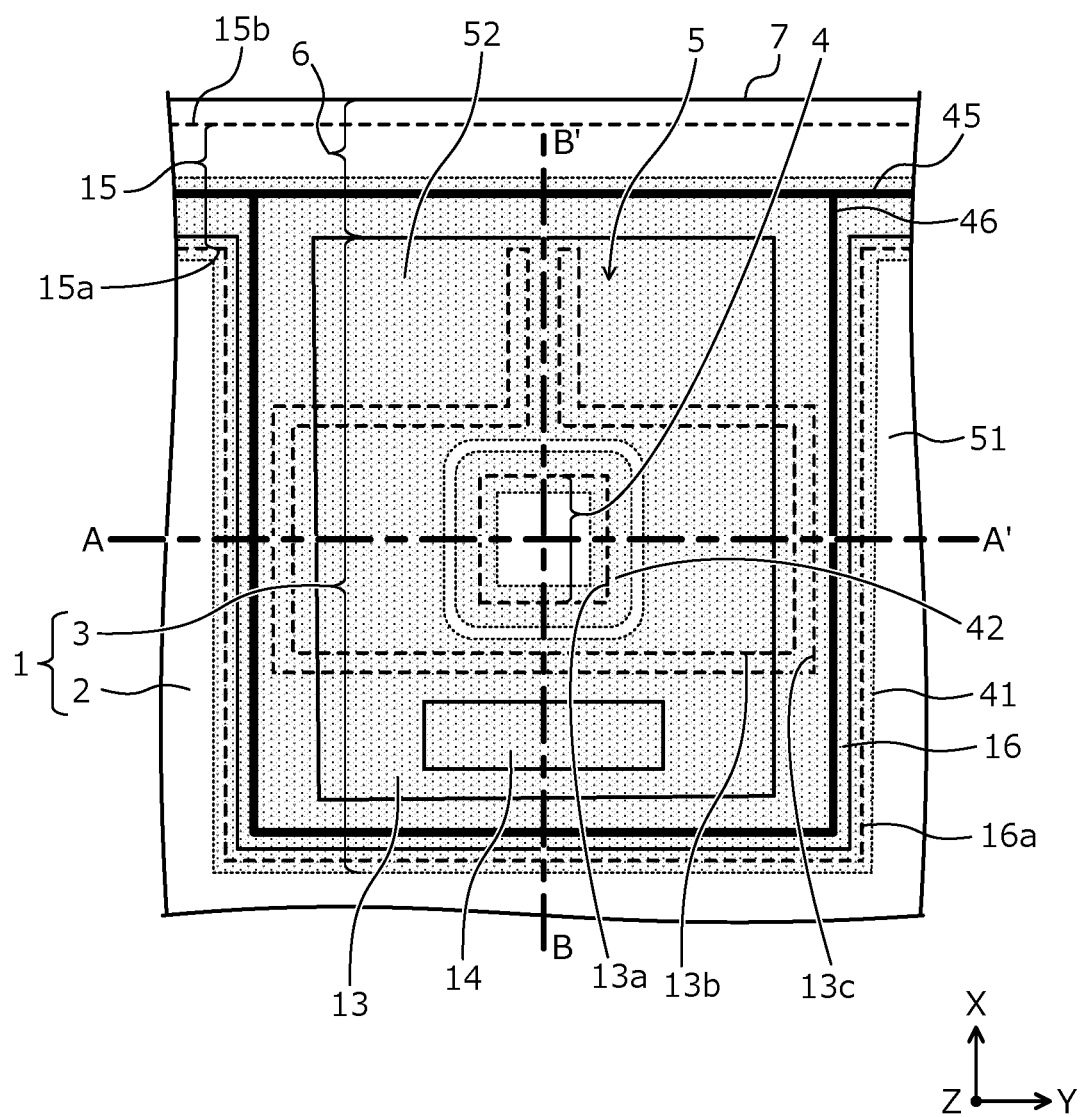
FIG. 2 is an enlarged plan view of a second cell region in FIG. 1.
Figure 3:
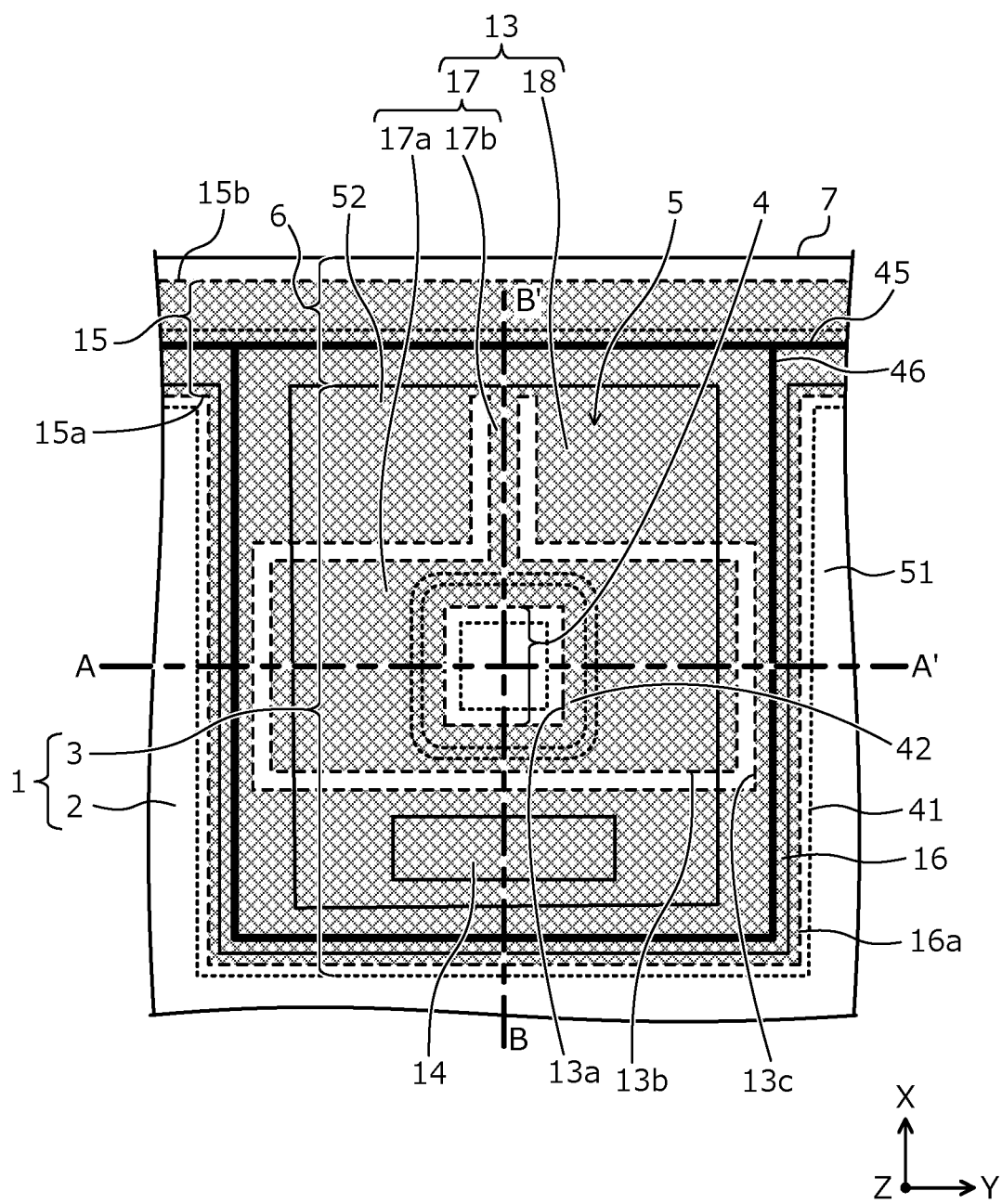
FIG. 3 is an enlarged plan view of the second cell region in FIG. 1.
Figure 4:
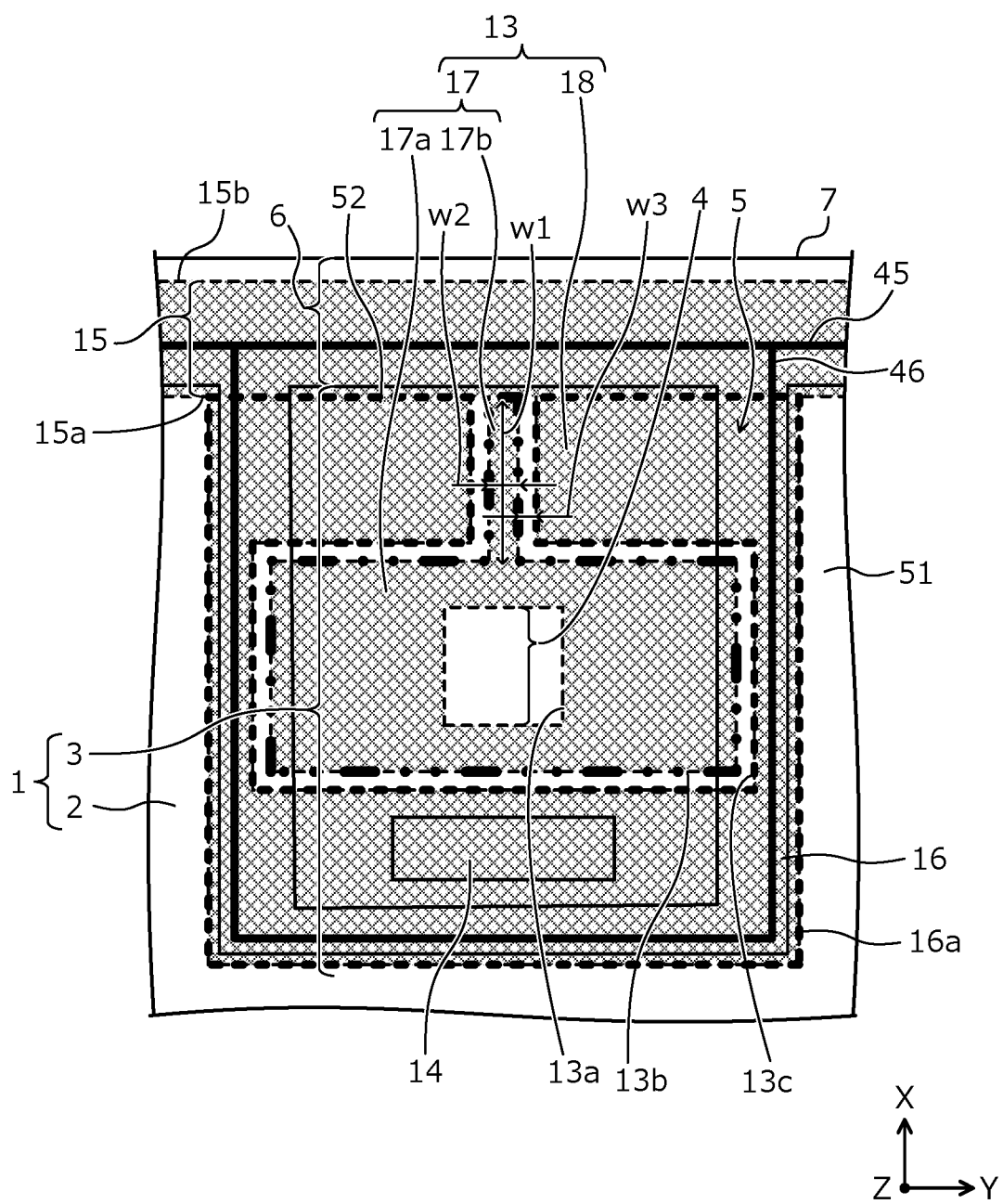
FIG. 4 is an enlarged plan view of the second cell region in FIG. 1.
Figure 5:
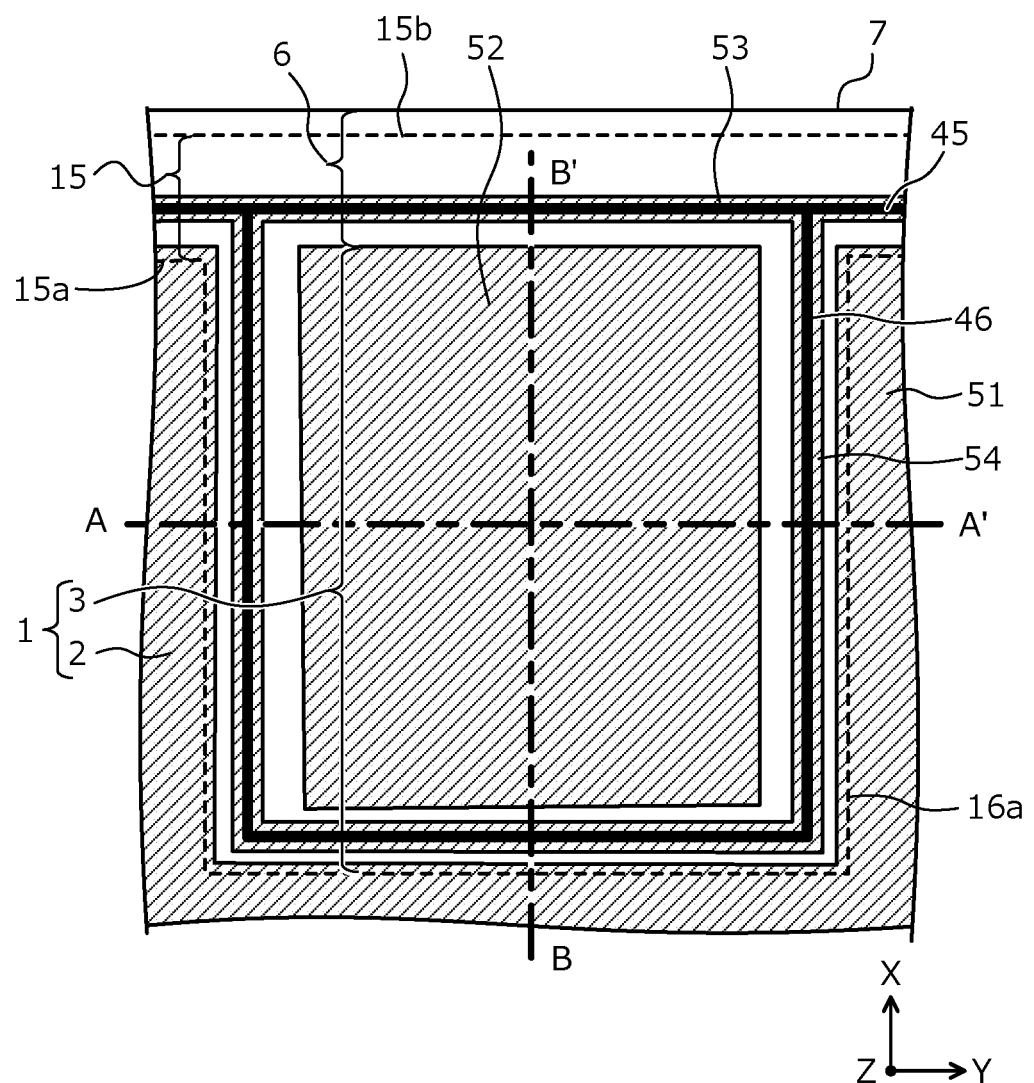
FIG. 5 is an enlarged plan view of the second cell region in FIG. 1.
Figure 6:
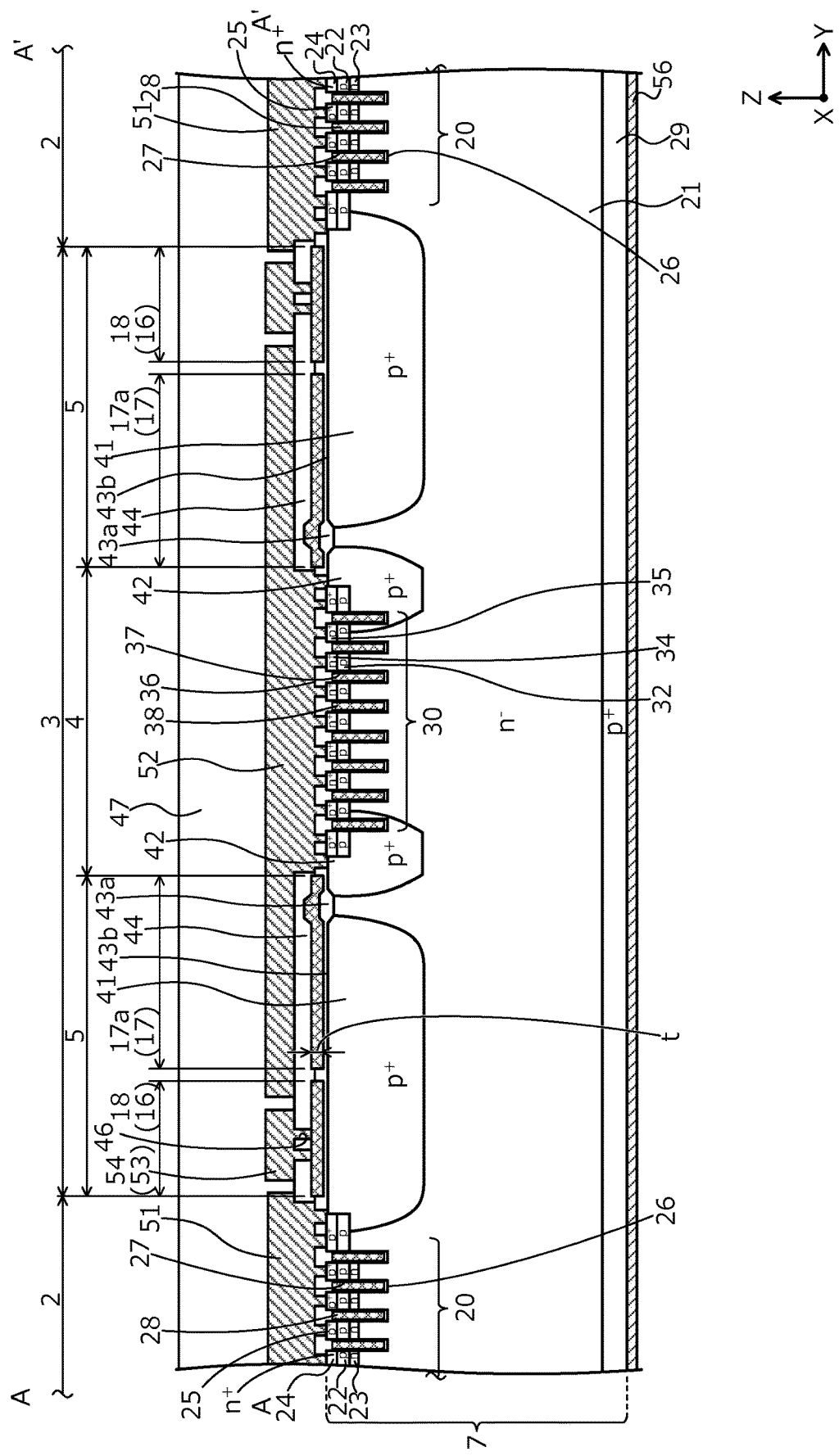
FIG. 6 is a cross-sectional view of a structure along cutting line A-A' in FIG. 2.
Figure 7:
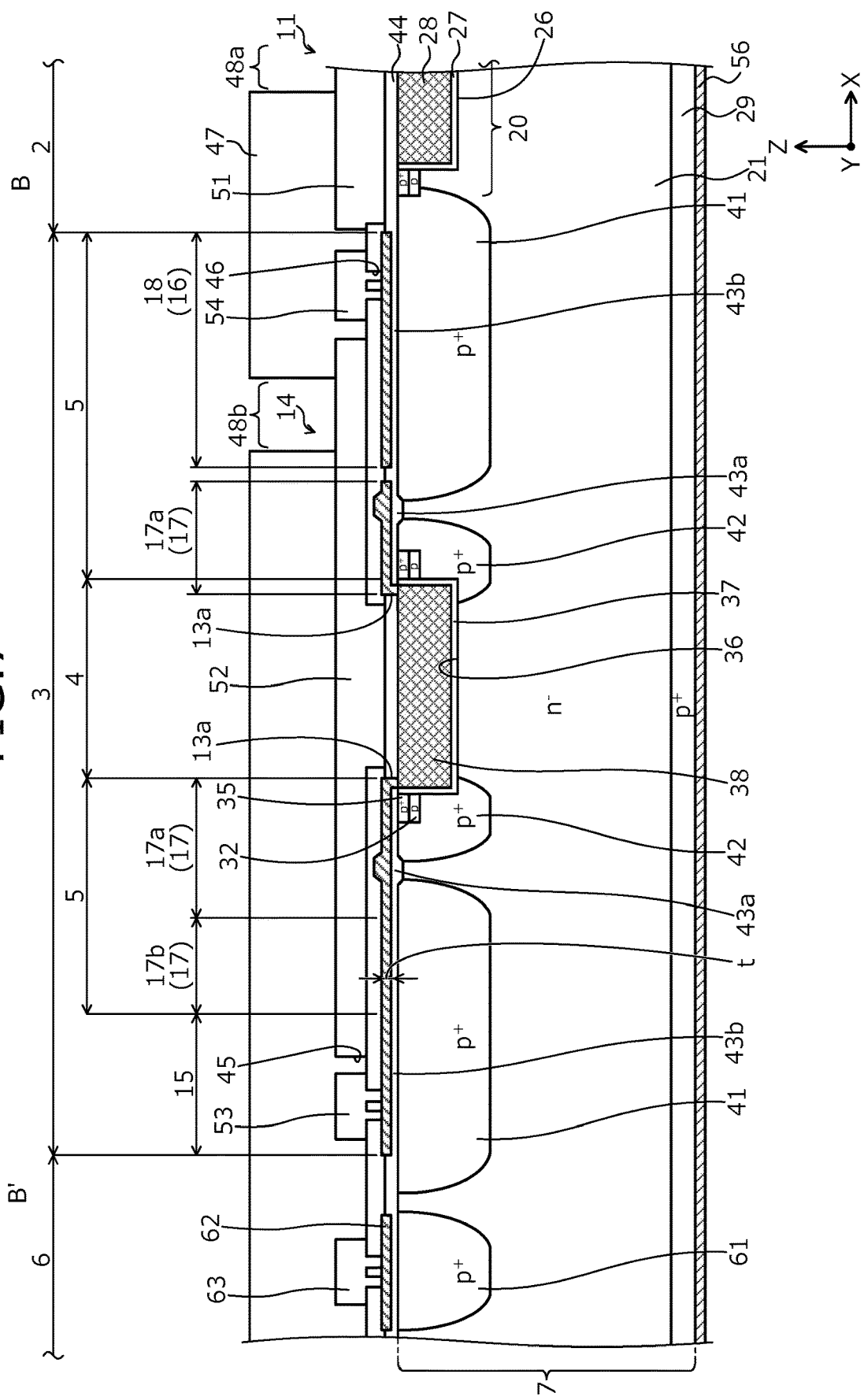
FIG. 7 is a cross-sectional view of the structure along cutting line B-B' in FIG. 2.

FIGS. 2 to 5 depict a same region in FIG. 1, however, portions indicated by hatching therein differ. In FIGS. 1 and 2, first and second p$^+$-type isolating regions 41, 42 indicated by hatching. In FIGS. 3 and 4, the gate runner 15 and a sensing polysilicon layer 13 containing polysilicon (poly-Si) are indicated by hatching. In FIG. 5, emitter electrodes 51, 52, the gate runner metal (metal layer) 53 and the extended portion 54 of the gate runner metal 53 are indicated by hatching. FIGS. 6 and 7 are cross-sectional views of the structure along cutting line A-A' and cutting line B-B' in FIG. 2, respectively.

A semiconductor device 10 according to the first embodiment depicted in FIGS. 1 to 5 includes, on a semiconductor substrate (semiconductor chip) 7, a main IGBT (first IGBT) 20 and a current sensing region that detects current flowing in the main IGBT 20. The current sensing region includes a sensing IGBT (second IGBT) 30 that has unit cells (functional units of an element) that each has a configuration similar to a configuration of each unit cell of the main IGBT 20, the sensing IGBT 30 having fewer unit cells than the main IGBT 20. An equivalent circuit diagram of the semiconductor device 10 according to the first embodiment corresponds to a portion surrounded by a rectangle and indicated by reference character 91b in FIG. 19. The main IGBT 20 and the sensing IGBT 30 are trench gate type IGBTs that are structured similarly. While it is preferable for the main IGBT 20 and the sensing IGBT 30 to include unit cells with the same configuration, the structure may differ. A ratio of the collector-emitter current when the main IGBT 20 and the sensing IGBT 30 are ON suffices to be settable. ON voltages of the main IGBT 20 and the sensing IGBT 30 may be the same.

In the semiconductor substrate 7, an active region 1 and an edge termination region 6 are provided. The active region 1 has first and second cell regions 2, 3, and a substantially rectangular planar shape. The edge termination region 6 surrounds a periphery of the active region 1. The edge termination region 6 is a region between the active region 1 and ends of the semiconductor substrate 7, the edge termination region 6 mitigating electric field of a front side of the semiconductor substrate 7 and sustaining a breakdown voltage. The breakdown voltage is a voltage limit at which no erroneous operation or destruction of an element occurs. In the edge termination region 6, a voltage withstanding structure such as a field limiting ring (FLR) 61, a field plate 63 (refer to FIG. 7), etc. are disposed.

In the first cell region 2, the first p$^+$-type isolating region 41 described hereinafter is disposed in the semiconductor substrate 7 so as to surround a periphery of the first cell region 2. In the first cell region 2, in a region thereof surrounded by the first p$^+$-type isolating region 41, the unit cells of the main IGBT 20 are disposed. The first cell region 2 is an operating region of the main IGBT 20. The first cell region 2 is a portion of the active region 1 excluding the second cell region 3 and occupying a majority of a surface area of the active region 1. In particular, the first cell region 2 has a substantially rectangular planar shape that has a portion recessed inwardly in a plan view.

Further, in the first cell region 2, the emitter electrode 51 of the main IGBT 20 is provided on a front surface of the semiconductor substrate 7. The emitter electrode 51 covers substantially an entire area of the first cell region 2. An emitter pad 11 is configured by a portion of the emitter electrode 51. Near a border between the first cell region 2 and the edge termination region 6, a gate pad metal 55 (refer to FIG. 17) is disposed on the front surface of the semiconductor substrate 7 via the interlayer insulating film 44. A gate pad 12 is configured by a portion of the gate pad metal 55. Input terminals for inputting gate voltage to gate electrodes 28, 38 are electrically connected to the gate pad 12.

Figure 17:
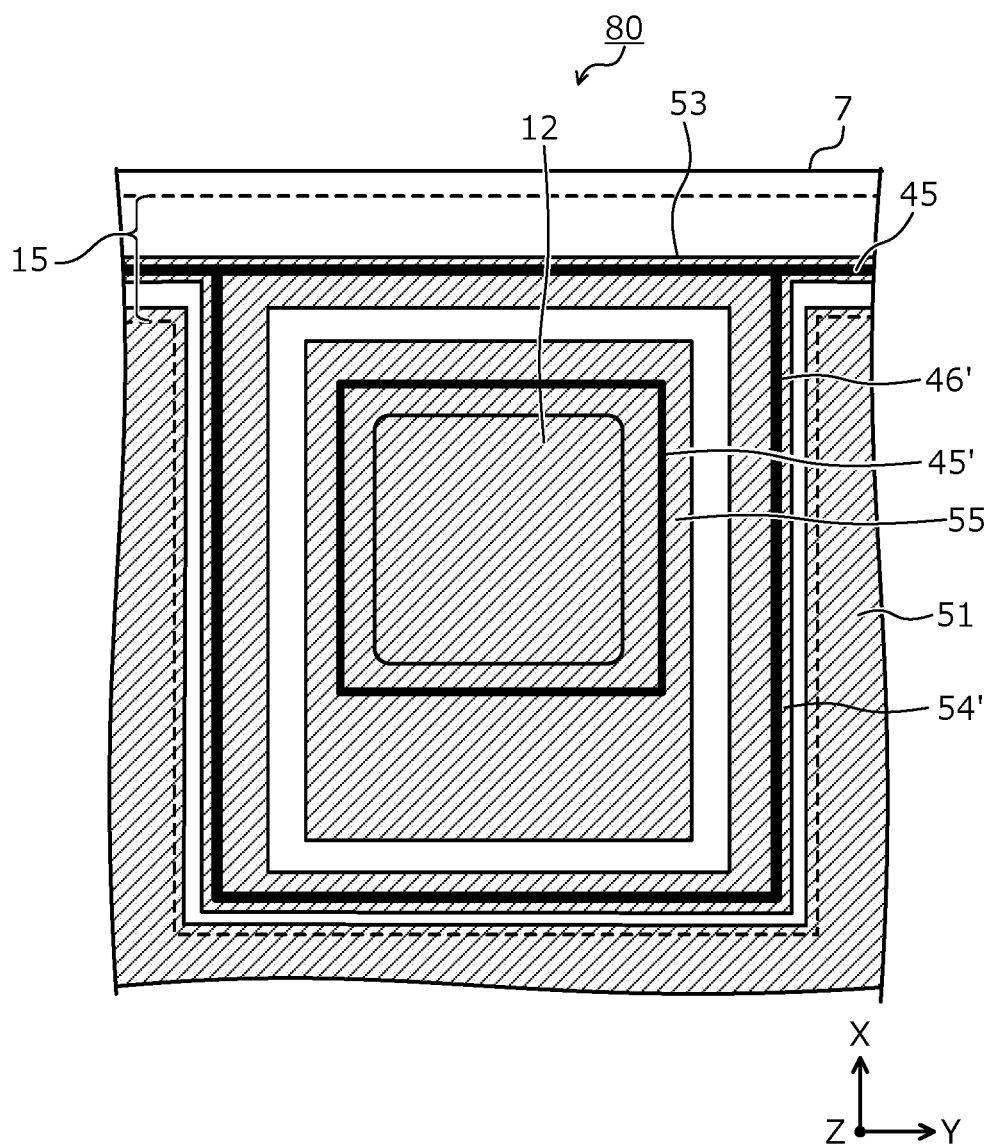
FIG. 17 is a plan view of a layout of a portion of the semiconductor device according to the fourth embodiment, viewed from the front side of the semiconductor substrate.

A periphery of the gate pad metal 55 is surrounded by portions (hereinafter, extended portions) 16', 54' that extend from the gate runner 15 and the gate runner metal 53, respectively (refer to FIGS. 16, 17). The extended portion 54' of the gate runner metal 53 is in contact with the extended portion 16' of the gate runner 15 via a contact hole 46' of the interlayer insulating film 44. The first p$^+$-type isolating region 41 extends in substantially an entire area of a surface region of the semiconductor substrate 7, in a region surrounded by the extended portion 16' of the gate runner 15. The gate pad metal 55 is electrically connected to the gate runner 15 containing polysilicon.

In the second cell region 3, the unit cells of the sensing IGBT 30 are disposed. The second cell region 3 has a substantially rectangular planar shape in contact with the edge termination region 6. In particular, the second cell region 3 is disposed in the recessed portion of the first cell region 2, three edges of the second cell region 3 facing the first cell region 2 and a remaining one edge thereof facing the edge termination region 6. The second cell region 3 has a detecting region (first region) 4 in which the unit cells of the sensing IGBT 30 are disposed and an extracting region (second region) 5 for pulling out hole current. From the detecting region 4, a main current flowing in the sensing IGBT 30 (the collector-emitter current) is pulled out and detected.

Based on the amount of the main current flowing in the sensing IGBT 30 and the number of the unit cells of the sensing IGBT 30, a main current flowing in the main IGBT 20 is calculated and it is determined whether the main current flowing in the main IGBT 20 is overcurrent. In the second cell region 3, the main IGBT 20 is not disposed. The detecting region 4, for example, has a substantially rectangular planar shape. The extracting region 5, for example, surrounds a periphery of the detecting region 4 in a substantially rectangular shape. In the extracting region 5, the first and the second p$^+$-type isolating regions 41, 42 are disposed in surface regions of the semiconductor substrate 7, to be apart from one another.

The first p$^+$-type isolating region 41 occupies a majority of the surface area of the extracting region 5 and, for example, surrounds a periphery of the detecting region 4 in a substantially rectangular shape. Further, the first p$^+$-type isolating region 41 extends to the first cell region 2, from the extracting region 5. The second p$^+$-type isolating region 42 is disposed between the first p$^+$-type isolating region 41 and the detecting region 4, and surrounds a periphery of the detecting region 4. The first and the second p$^+$-type isolating regions 41, 42 are electrically connected to the emitter electrode 51 of the main IGBT 20 and the emitter electrode 52 of the sensing IGBT 30, respectively.

The first cell region 2 is isolated from regions other than the first cell region 2 by a pn junction between the first p$^+$-type isolating region 41 and an n$^-$-type drift region 21 (refer to FIGS. 5, 6). The detecting region 4 of the second cell region 3 is isolated from regions other than the detecting region 4 by a pn junction between the second p$^+$-type isolating region 42 and the n$^-$-type drift region 21. Further, the first and the second p$^+$-type isolating regions 41, 42 have a function of pulling out hole current (holes) to the emitter electrodes 51, 52, respectively, the hole current (holes) that occurs in the edge termination region 6 and flows in the semiconductor substrate 7, toward the first and the second cell regions 2, 3 when avalanche breakdown occurs in the edge termination region 6 during turn OFF of the main IGBT 20.

Further, in the extracting region 5, the sensing polysilicon layer (first gate electrode layer) 13 containing polysilicon (poly-Si) is disposed on the front surface of the semiconductor substrate 7 via a field oxide film 43b. The sensing polysilicon layer 13 covers substantially an entire area of the extracting region 5 via the field oxide film 43b. The sensing polysilicon layer 13 has a sensing capacitance region 18 and a built-in resistance region 17 containing polysilicon (refer to FIG. 4). The built-in resistance region 17 and the sensing capacitance region 18 are disposed to be apart from one another. In FIG. 4, ranges of the built-in resistance region 17 and the sensing capacitance region 18 are surrounded by a bold double-dot-dashed line and a bold dashed line, respectively.

The built-in resistance region 17 is a connector region of the gate electrodes 38 of the sensing IGBT 30 (refer to FIGS. 6, 7) and the gate runner 15. The built-in resistance region 17 has a first portion (first gate electrode layer portion) 17a that is electrically connected to the gate electrodes 38 of the sensing IGBT 30 (refer to FIG. 7) and a second portion (second gate electrode layer portion) 17b that connects the first portion 17a to the gate runner 15 (refer to FIGS. 3, 4). Series resistance of the first and the second portions 17a, 17b of the built-in resistance region 17 functions as built-in resistance of the sensing IGBT 30 and a resistance value thereof is a sum of the resistance values of the first and the second portions 17a, 17b of the built-in resistance region 17.

The built-in resistance region 17 is in a state of being electrically connected between the gate electrodes 28 of the main IGBT 20 and the gate electrodes 38 of the sensing IGBT 30, as built-in resistance of the sensing IGBT 30. The first portion 17a of the built-in resistance region 17 surrounds a periphery of the detecting region 4. A shape of a contour of an outer peripheral edge of the first portion 17a of the built-in resistance region 17 is substantially a rectangular shape that is larger than the detecting region 4.

Outer peripheral edges 13b of the first portion 17a of the built-in resistance region 17 are favorably apart from the detecting region 4 in a second direction Y described hereinafter. The outer peripheral edges 13b of the first portion 17a of the built-in resistance region 17 being apart from the detecting region 4 enables imbalance of built-in resistance values occurring due to trenches 36 of the sensing IGBT 30 to be reduced. Inner peripheral edges (edges closest to the detecting region 4) 13a of the first portion 17a of the built-in resistance region 17 extend toward the detecting region 4, from the extracting region 5, and are in contact with the gate electrodes 38 of the sensing IGBT 30 (refer to FIG. 7).

The second portion 17b of the built-in resistance region 17 is positioned between the first portion 17a of the built-in resistance region 17 and the gate runner 15, and connects the first portion 17a of the built-in resistance region 17 and the gate runner 15. The second portion 17b of the built-in resistance region 17 is an area connected to the gate runner 15 and is favorably disposed to have line symmetry centered on an axis (axis parallel to cutting line B-B') forming a right angle with the gate runner 15, in the extracting region 5, for example, the second portion 17b being parallel to the axis and extending in a linear shape, in a direction (hereinafter, first direction) X parallel to the front surface of the semiconductor substrate 7.

Resistance of the built-in resistance region 17 is higher, the longer is a length w1 of the second portion 17b in the first direction X, the narrower is a width w2 of the second portion 17b in the direction (hereinafter, the second direction) Y orthogonal to the first direction x and parallel to the front surface of the semiconductor substrate 7, and the thinner is a thickness t of the built-in resistance region 17 in a direction (thickness direction Z) orthogonal to the front surface of the semiconductor substrate 7 (refer to FIG. 7). A resistance value of the second portion 17b of the built-in resistance region 17 is calculated by $\rho \times w1/(w2 \times t)$. Where, $\rho$ is resistivity of the sensing polysilicon layer 13, w1 is the length of the second portion 17b of the built-in resistance region 17 in the first direction X, and (w2×t) is the surface area of the second portion 17b of the built-in resistance region 17. The resistance value of the built-in resistance region 17 is favorably in a range from about $10\Omega$ to $5000\Omega$.

The sensing capacitance region 18 is disposed to be apart from the built-in resistance region 17, separated by a predetermined distance w3, and the sensing capacitance region 18 surrounds a periphery of the built-in resistance region 17. In FIGS. 2 to 4, the outer peripheral edges of the first portion 17a of the built-in resistance region 17 are indicated by a bold double-dot-dashed line assigned reference character 13b. An inner periphery of the sensing capacitance region 18 is indicated by a bold dashed line assigned reference character 13c. The sensing capacitance region 18 is connected to the extended portion 16 of the gate runner 15 described hereinafter. Capacitance formed by the sensing capacitance region 18 and, the interlayer insulating film 44 and the emitter electrode 52 is a portion of the gate-emitter capacitance CGE of the sensing IGBT 30. The emitter electrode 52 of the sensing IGBT 30 extends on the sensing polysilicon layer 13 via the interlayer insulating film 44 (refer to FIG. 6). Further, when capacitance of the sensing IGBT 30 is to be reduced, the sensing capacitance region 18 may be omitted.

The emitter electrode 52 of the sensing IGBT 30 is provided spanning substantially an entire area of the second cell region 3. The emitter electrode 52 of the sensing IGBT 30 is disposed to be apart from the emitter electrode 51 of the main IGBT 20. The sensing emitter pad 14 is a portion of the emitter electrode 52, exposed in an opening 48b of a passivation film 47, and is configured by a portion of the emitter electrode 52. For example, the built-in resistance region 17 is disposed between the sensing emitter pad 14 and the gate runner 15. The sensing emitter pad 14 faces the sensing capacitance region 18 with the interlayer insulating film 44 intervening therebetween.

The gate runner 15 is disposed in the edge termination region 6, surrounding a periphery of the active region 1. Further, the gate runner 15 has the portion (hereinafter, extended portion) 16 that extends in the second cell region 3, along an outer periphery of the second cell region 3. The extended portion 16 of the gate runner 15 is a portion of the sensing polysilicon layer 13. The extended portion 16 of the gate runner 15 surrounds a periphery of the second cell region 3. A single polysilicon layer formed by the gate runner 15 and the extended portion 16 of the gate runner 15 extends along an outer periphery of the first cell region 2, surrounding a periphery of the first cell region 2.

The gate runner metal 53 and the extended portion 54 of the gate runner metal 53 respectively face the gate runner 15 and the extended portion 16 of the gate runner 15 in the thickness direction Z, across the interlayer insulating film 44 intervening therebetween, the gate runner metal 53 and the extended portion 54 being in contact with the gate runner 15 and the extended portion 16 of the gate runner 15, via the contact holes 45, 46 that penetrate through the interlayer insulating film 44 in the thickness direction Z.

In FIGS. 2 to 4, an inner periphery (edges closest to the detecting region 4) of the sensing polysilicon layer 13 is indicated by a dashed line assigned reference character 13a. In FIGS. 2 to 5, an inner periphery (edges closest to the active region 1) of a portion of the gate runner 15, surrounding a periphery of the active region 1, and an outer periphery (edges closest to the ends of the semiconductor substrate 7) of the gate runner 15 are indicated by dashed lines assigned reference characters 15a, 15b. Edges of the extended portion 16 of the gate runner 15 in the active region 1 are indicated by reference character 16a. The gate electrodes 28, 38 of the main IGBT 20 and the sensing IGBT 30 (refer to FIGS. 6, 7) are electrically connected to the gate runner 15.

A cross-section of the structure of the semiconductor device 10 according to the first embodiment is described. As depicted in FIGS. 6 and 7, in the semiconductor device 10 according to the first embodiment, the unit cells of the main IGBT 20 are included in the first cell region of the active region 1 and the unit cells the sensing IGBT 30 are included in in the second cell region of the active region 1. The unit cells of the main IGBT 20 are configured by p-type base regions 22, $n^+$-type emitter regions 24, $p^+$-type contact regions 25, trenches 26, gate insulating films 27, and the gate electrodes 28 provided in the semiconductor substrate 7, at a front side thereof. The unit cells of the main IGBT 20 have general trench gate structure having the gate electrodes 28 that are embedded in the trenches 26 via the gate insulating films 27, and that extend in a depth direction (the thickness direction Z) of the semiconductor substrate 7.

The unit cells of the main IGBT 20 are disposed in the first cell region 2, a region thereof surrounded by the first $p^+$-type isolating region 41. The p-type base regions 22, the $n^+$-type emitter regions 24, and the $p^+$-type contact regions 25 are provided in surface regions of the front surface of the semiconductor substrate 7. The $n^+$-type emitter regions 24 and the $p^+$-type contact regions 25 are disposed between adjacent trenches 26 of the trenches 26 (mesa regions), at positions shallower from the front surface of the semiconductor substrate 7 than are the p-type base regions 22. In a mesa region near the outer periphery of the first cell region 2, the n+-type emitter regions 24 are not disposed, only the p+-type contact regions 25 are disposed.

In the semiconductor substrate 7, the n−-type drift region 21 is provided at a position deeper from the front surface of the semiconductor substrate 7 than are the p-type base regions 22. Regions (hereinafter, storage regions) 23 that store charge (holes) that becomes minority carriers during an ON state may be provided between the p-type base regions 22 and the n−-type drift region 21. The storage regions 23 are n-type regions having an impurity concentration that is higher than an impurity concentration of the n−-type drift region 21. The trenches 26, for example, are disposed in a striped pattern that extends in the first direction X described hereinafter. The gate electrodes 28 are provided in the trenches 26 via the gate insulating films 27.

One of the unit cells of the main IGBT 20 is configured by one of the trenches 26 embedded with the gate electrodes 28 and a mesa region adjacent to the one trench 26 of trenches 26. The first p+-type isolating region 41 is in contact with the p-type base regions 22 and the p+-type contact regions 25, near the outer periphery of the first cell region 2. A depth of the first p+-type isolating region 41 is deeper than a depth of the trenches 26. The emitter electrode 51 of the main IGBT 20 is in contact with the n+-type emitter regions 24, the p+-type contact regions 25, and the first p+-type isolating region 41, via contact holes that penetrate through the interlayer insulating film 44 in the thickness direction Z.

The emitter electrode 51 may be electrically connected to the n+-type emitter regions 24, the p+-type contact regions 25, and the first p+-type isolating region 41, via a barrier metal and contact plugs. The barrier metal contains a metal that has high adhesion to a semiconductor region (the semiconductor substrate 7) and forms an ohmic contact with the semiconductor region. In particular, the barrier metal, for example, may be a stacked film in which a titanium (Ti) film and a titanium nitride (TiN) film are sequentially stacked. The contact plugs, for example, are a metal film that contains, as a material, tungsten (W), which has high embeddability, the contact plugs being embedded in contact holes of the interlayer insulating film 44 via the barrier metal.

The emitter electrode 51, for example, is an aluminum-silicon (Al—Si) electrode. The emitter electrode 51 is electrically insulated from the gate electrodes 28 by the interlayer insulating film 44. The emitter electrode 51 is covered by the passivation film 47. The emitter pad 11 is configured by a portion of the emitter electrode 51, exposed in an opening 48a of the passivation film 47. In a surface layer on a back surface of the semiconductor substrate 7, a p+-type collector region 29 of the main IGBT 20 is provided spanning an entire area of the back surface of the semiconductor substrate 7. A collector electrode 56 of the main IGBT 20 is provided spanning an entire area of the back surface of the semiconductor substrate 7.

The unit cells of the sensing IGBT 30 are disposed in the detecting region 4 of the second cell region 3, in a region thereof surrounded by the second p+-type isolating region 42. The unit cells of the sensing IGBT 30 are configured by p-type base regions 32, n+-type emitter regions 34, p+-type collector regions 35, the trenches 36, gate insulating films 37, and the gate electrodes 38 provided in the semiconductor substrate 7, at a front surface thereof. The unit cells of the sensing IGBT 30, similarly to the unit cells of the main IGBT 20, have a general trench gate structure having the gate electrodes 38 that are embedded in the trenches 36 and that extend in the depth direction of the semiconductor substrate 7.

The n+-type emitter regions 34 and the p+-type collector regions 35 are disposed between adjacent trenches 36 of the trenches 36 (mesa regions), at positions shallower from the front surface of the semiconductor substrate 7 than are the p-type base regions 32. In a mesa region near an outer periphery of the detecting region 4 of the second cell region 3, the n+-type emitter regions 34 are not provided, only the p+-type collector regions 35 are provided. At a position deeper from the front surface of the semiconductor substrate 7 that are the p-type base regions 32, the n−-type drift region 21 extends from the first cell region 2.

Storage regions may be provided between the p-type base regions 32 and the n−-type drift region 21. A reason that storage regions may be omitted in the sensing IGBT 30 is as follows. By not providing storage regions of the sensing IGBT 30, an injection enhanced (IE) effect in the sensing IGBT 30 may be reduced and decreases in turn OFF tolerance due to minority carrier storage may be suppressed.

The trenches 36, for example, are disposed in a striped pattern extending in the first direction X that is a same direction in which the trenches 26 of the main IGBT 20 extend. The gate electrodes 38 are embedded in the trenches 36 via the gate insulating films 37. One of the unit cells of the sensing IGBT 30 is configured by one of the trenches 36 embedded the gate electrodes 38 and a mesa region adjacent to the one trench 36 of the trenches 36. Depths of the p-type base regions 32, the n+-type emitter regions 34, the p+-type collector regions 35, and the trenches 36 are equal to the depths of the corresponding parts of the main IGBT 20.

The second p+-type isolating region 42 is in contact with the p-type base regions 32 and the p+-type collector regions 35, near the outer periphery of the second cell region 3. A depth of the second p+-type isolating region 42 is equal to the depth of the first p+-type isolating region 41. The p-type base regions 32 and the p+-type collector regions 35 may extend in the second p+-type isolating region 42, in the first direction X, toward the extracting region 5, from the detecting region 4. The second p+-type isolating region 42 extends from the extracting region 5 and may reach, of the trenches 36, a trench 36 that is disposed closest to the extracting region 5, or may be included in said trench 36.

The emitter electrode 52 of the sensing IGBT 30 is in contact with the n+-type emitter regions 34, the p+-type collector regions 35, and the second p+-type isolating region 42, via contact holes that penetrate through the interlayer insulating film 44 in the thickness direction Z. The emitter electrode 52 may be electrically connected to the n+-type emitter regions 34, the p+-type collector regions 35, and the second p+-type isolating region 42, via a barrier metal and contact plugs. Materials of the emitter electrode 52, the barrier metal, and the contact plugs are similar to the materials of the emitter electrode 51 of the main IGBT 20, the barrier metal, and the contact plugs.

The emitter electrode 52 is electrically insulated from the gate electrodes 38 by the interlayer insulating film 44. The emitter electrode 52 is covered by the passivation film 47. The sensing emitter pad 14 is configured by a portion of the emitter electrode 52, exposed in the opening 48b of the passivation film 47. The sensing emitter pad 14, for example, may be disposed in the extracting region 5 of the second cell region 3. The p+-type collector region 29 and the collector electrode 56 of the main IGBT 20 respectively serve as a p+-type collector region and a collector electrode of the sensing IGBT 30.

In the extracting region 5 of the second cell region 3, the first and the second p+-type isolating regions 41, 42 are selectively provided in the semiconductor substrate 7, in a surface layer thereof on the front surface of the semiconductor substrate 7. The first and the second p+-type isolating regions 41, 42 are isolated from one another by a local insulating film 43a such as a field oxide film or a local oxidation of silicon (LOCOS) provided on the front surface of the semiconductor substrate 7. The first p+-type isolating region 41 extends to the outer periphery of the first cell region 2, from the extracting region 5. The second p+-type isolating region 42 is disposed closer to the detecting region 4 than is the first p+-type isolating region 41 and extends to an outer peripheral region of the detecting region 4, from the extracting region 5.

In the extracting region 5, the built-in resistance region 17 and the sensing capacitance region 18 of the sensing polysilicon layer 13 are provided on the front surface of the semiconductor substrate 7 via the field oxide film 43b. The first portion 17a of the built-in resistance region 17 faces the first and the second p+-type isolating regions 41, 42 in the thickness direction Z, across the field oxide film 43b and the local insulating film 43a. The first portion 17a of the built-in resistance region 17, for example, extends in the first direction X into ends of the trenches 36 of the sensing IGBT 30 to be in contact with the gate electrodes 38.

The second portion 17b of the built-in resistance region 17 is disposed closer to the edge termination region 6 than is the first portion 17a of the built-in resistance region 17, and is connected to the first portion 17a of the built-in resistance region 17. The second portion 17b of the built-in resistance region 17 faces the first p+-type isolating region 41 in the thickness direction Z, across the field oxide film 43b intervening therebetween. The sensing capacitance region 18 is disposed closer to the first cell region 2 than is the built-in resistance region 17 and is disposed to be apart from the built-in resistance region 17. The sensing capacitance region 18 faces the first p+-type isolating region 41 in the thickness direction Z, across the field oxide film 43b intervening therebetween.

The second portion 17b of the built-in resistance region 17 extends toward the edge termination region 6 and is connected to the gate runner 15. The sensing capacitance region 18 serves as the extended portion 16 of the gate runner 15 and is connected to the gate runner 15. The emitter electrode 52 of the sensing IGBT 30 extends on the first and the second portions 17a, 17b of the built-in resistance region 17 and on the sensing capacitance region 18, from the detecting region 4 via the interlayer insulating film 44. The emitter electrode 51 of the main IGBT 20 extends on the sensing capacitance region 18, from the first cell region 2 via the interlayer insulating film 44.

The first and the second portions 17a, 17b of the built-in resistance region 17 and the sensing capacitance region 18 are electrically insulated from the emitter electrodes 51, 52 by the interlayer insulating film 44. The gate runner metal 53 and the extended portion 54 of the gate runner metal 53 are respectively in contact with the gate runner 15 and the extended portion 16 of the gate runner 15 via the contact holes 45, 46 of the interlayer insulating film 44. In FIGS. 6 and 7, while an instance is depicted in which two each of the contact holes 45, 46 are provided, the number of the contact holes 45, 46 may be variously changed.

In the edge termination region 6, the field limiting ring 61 is provided singularly or in plural in a concentric shape surrounding a periphery of the active region 1, in a surface layer of the semiconductor substrate 7 at the front surface of the semiconductor substrate 7. On each of the field limiting rings 61, a polysilicon layer 62 is provided via the field oxide film 43b. On the polysilicon layer 62, the field plate 63 is provided via the interlayer insulating film 44. The field plate 63 is in contact with the polysilicon layer 62 via a contact hole in the interlayer insulating film 44.

Figure 18:
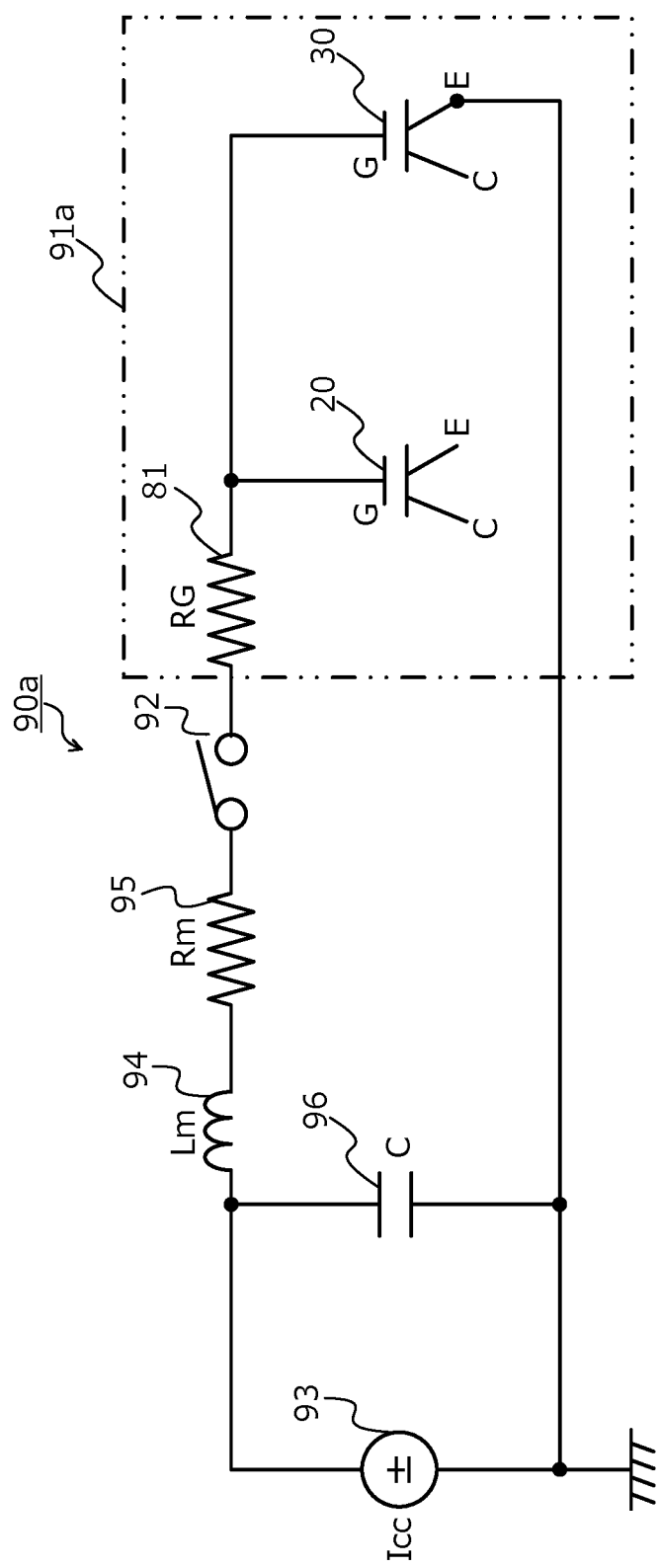
FIG. 18 is a circuit diagram of a machine model of an ESD evaluation device for evaluating ESD tolerance of a sensing IGBT.

For example, a circuit configuration of a machine model of ESD (electrostatic discharge) applied between the gate pad 112 and the sensing emitter pad 114 of the IGBTs 120, 130 of the conventional structure (refer to FIGS. 24, 28 to 31) is assumed. The machine model of ESD is an RLC circuit (resistor (R), inductance (Lm), and capacitor (C)) connected to the gate pad 112 of the IGBTs as shown in FIG. 18. Therefore, the ESD waveform oscillates satisfying resonance conditions of the RLC circuit (refer to FIG. 22).

When voltage of the first pulse of the ESD waveform due to the oscillation has a voltage value exceeding a gate insulation withstand voltage of the sensing IGBT 130, dielectric breakdown of the gate insulating films 137 in the gate trenches 136 of the sensing IGBT 130 occurs. Accordingly, the ESD tolerance of the sensing IGBT 130 has to be set so that the voltage value of the first pulse of the ESD waveform is at most the gate insulation withstand voltage of the sensing IGBT 130.

On the other hand, according to the first embodiment, the high built-in resistance configured by the second portion of the built-in resistance region containing polysilicon is connected to the gates of the sensing IGBT. Due to this built-in resistance region, dV/dt of the first pulse voltage of ESD decreases and therefore, a peak voltage of the first pulse of the ESD waveform decreases. As a result, the peak voltage of the first pulse of the ESD waveform does not easily become a voltage value exceeding the gate insulation withstand voltage of the sensing IGBT and dielectric breakdown of the gate insulating films in the gate trenches of the sensing IGBT does not easily occur, enabling the ESD tolerance to be enhanced.

Further, according to the first embodiment, the built-in resistance region containing polysilicon is provided, whereby the gate-emitter capacitance CGE of the sensing IGBT does not increase. Therefore, even when the ESD tolerance is enhanced by the built-in resistance region, the transient sensing voltage that increases proportionally to the magnitude of the gate-emitter capacitance CGE of the sensing IGBT may be set to be about equal to that of the conventional structure in which the built-in resistance is not provided. As a result, the ESD tolerance alone may be enhanced while the transient sensing voltage is kept low and therefore, the trade-off relationship between enhancing ESD tolerance of the current sensing region and reducing transient sensing voltage may be improved.

Next, a structure of a semiconductor device according to a second embodiment is described. FIGS. 8, 9, 10A, 10B, 11, 12A, and 12B are plan views of examples of layouts of a portion of the semiconductor device according to the second embodiment, viewed from the front side of the semiconductor substrate. A layout of an entire area of a semiconductor device 10' according to the second embodiment, viewed from the front surface of the semiconductor substrate 7 is similar to that of the semiconductor device 10 according to the first embodiment (refer to FIG. 1). In FIGS. 8 to 12, the second cell region 3 in FIG. 1 is enlarged, and the sensing polysilicon layer 13 and the gate runner 15 are indicated by hatching. In FIGS. 8 to 12, a region of the second portion 17b of the built-in resistance region 17 is surrounded by a bold double-dot-dashed line. Further, in FIGS. 8 to 12, the emitter electrodes 51, 52 are not depicted (refer to FIGS. 1, 4, 5).

The semiconductor device 10' according to the second embodiment differs from the semiconductor device 10 according to the first embodiment in that an arithmetic area that the first portion 17a' of the built-in resistance region 17 occupies in the extracting region 5 is small. The first portion 17a' of the built-in resistance region 17 suffices to be disposed to an extent to be able to connect the second portion 17b of the built-in resistance region 17 and the gate electrodes 38 of the sensing IGBT 30. For example, the first portion 17a' of the built-in resistance region 17 is provided along a border between the detecting region 4 and the extracting region 5 and surrounds a periphery of the detecting region 4 in a substantially rectangular shape. A shape of a contour of an outer peripheral edge of the first portion 17a' of the built-in resistance region 17 is substantially a rectangular shape that is slightly larger than the detecting region 4.

Figure 8:
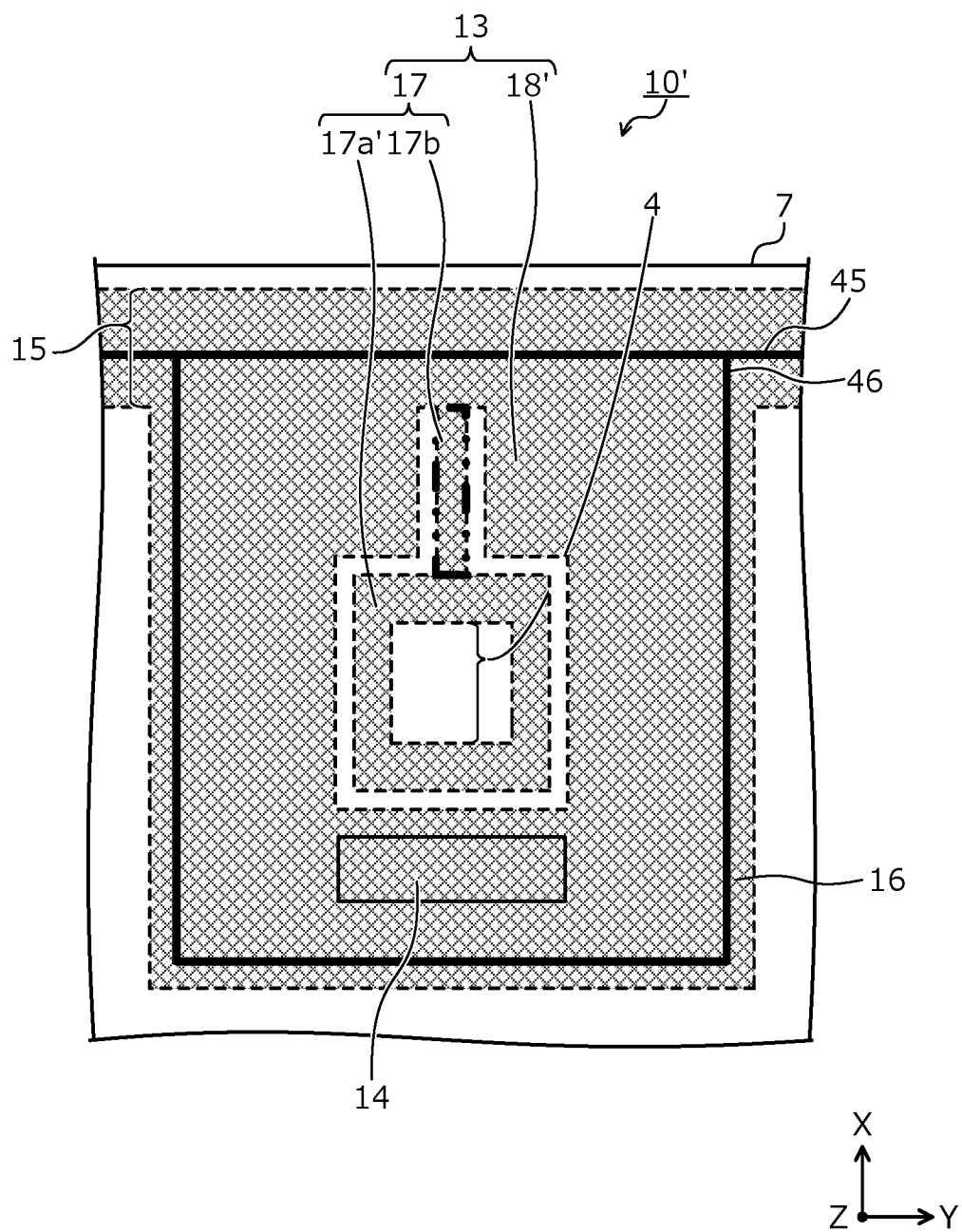
FIG. 8 is a plan view of an example of a layout of a portion of a semiconductor device according to a second embodiment, viewed from a front side of a semiconductor substrate.

The second portion 17b of the built-in resistance region 17, similarly to the first embodiment, has a linear planar shape extending in the first direction X. The second portion 17b of the built-in resistance region 17, similarly to the first embodiment, is positioned between the first portion 17a' of the built-in resistance region 17 and the gate runner 15, and connects the first portion 17a' of the built-in resistance region 17 and the gate runner 15 (FIG. 8).

The first portion 17a' of the built-in resistance region 17 and the extended portion 16 of the gate runner 15 may be connected by the second portion 17b' of the built-in resistance region 17 (FIG. 9). In this instance, for example, the second portion 17b' of the built-in resistance region 17 is positioned between the first portion 17a' of the built-in resistance region 17 and the extended portion 16 of the gate runner 15. The sensing emitter pad 14 is provided in the emitter electrode 52, in a region surrounded by the extended portion 16 of the gate runner 15.

Figure 10A:
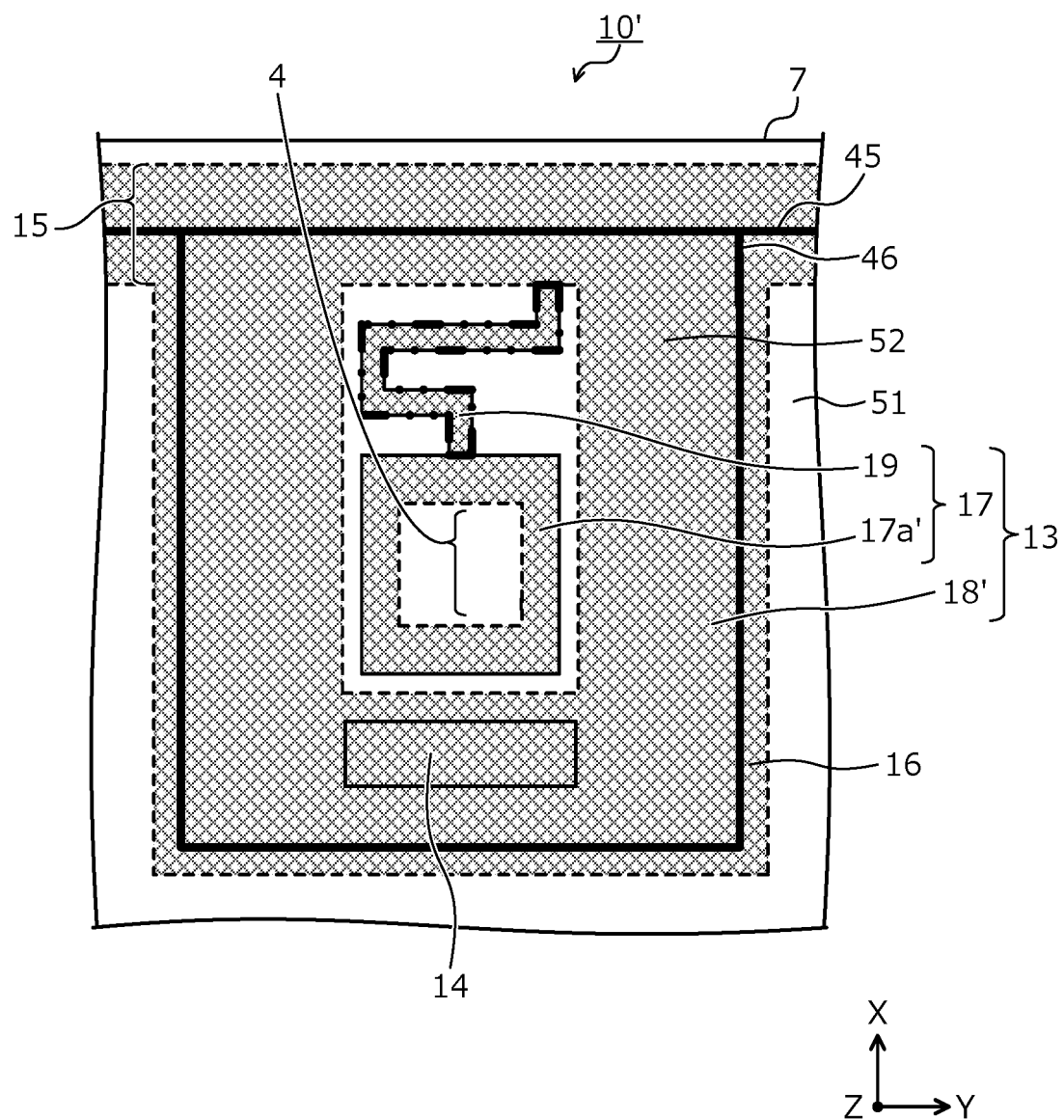
FIG. 10A is a plan view of an example of a layout of a portion of the semiconductor device according to the second embodiment, viewed from the front side of the semiconductor substrate.
Figure 10B:
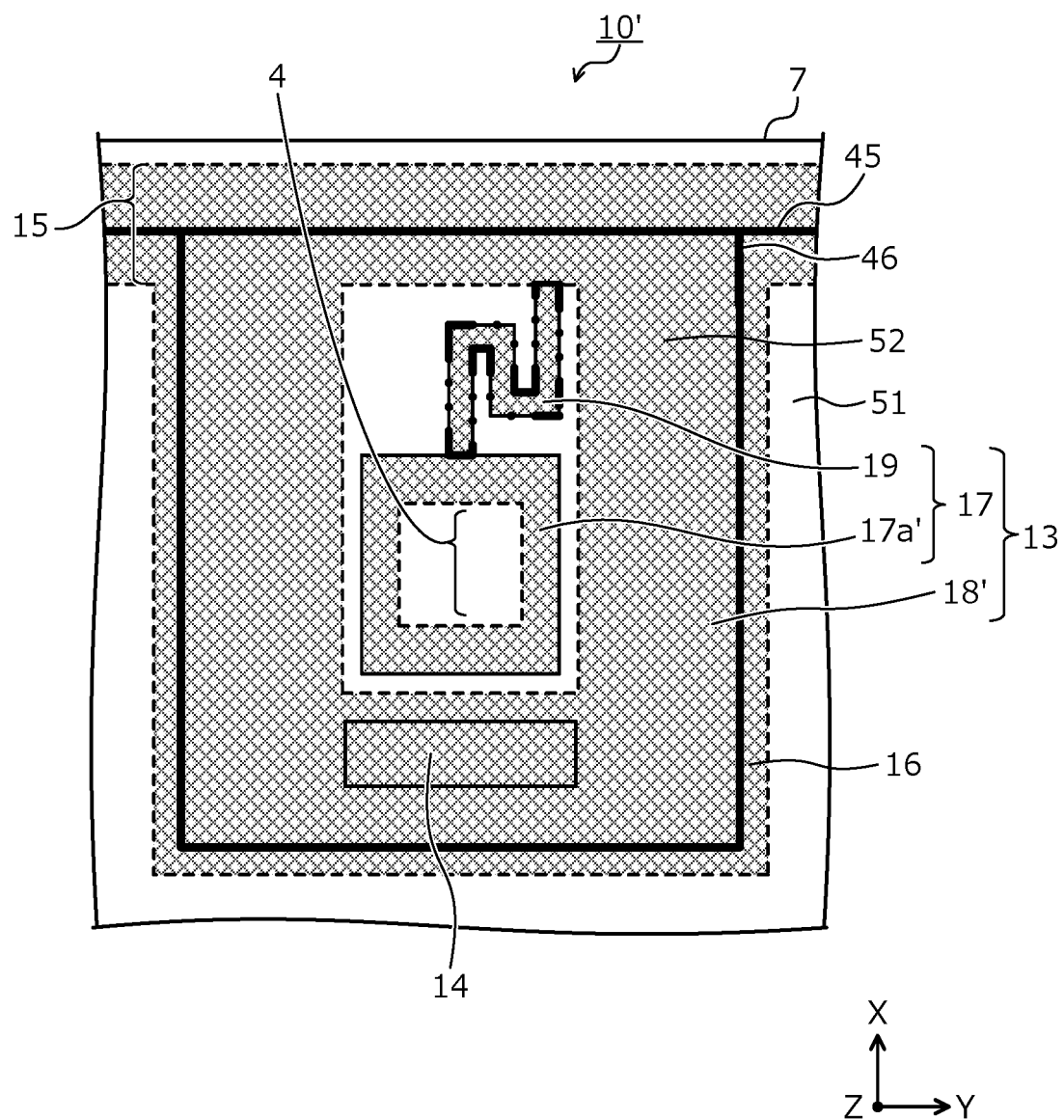
FIG. 10B is a plan view of an example of a layout of a portion of the semiconductor device according to the second embodiment, viewed from the front side of the semiconductor substrate.

Further, a second portion 19 of the built-in resistance region 17 may have a planar shape that extends meandering in an X direction or a Y direction from the first portion 17a' of the built-in resistance region 17 to the gate runner 15 (FIGS. 10B, 10A). In this instance, the second portion 19 of the built-in resistance region 17 is preferably connected to the first portion 17a' of the built-in resistance region 17, at a position facing a center of the detecting region 4.

Figure 11:
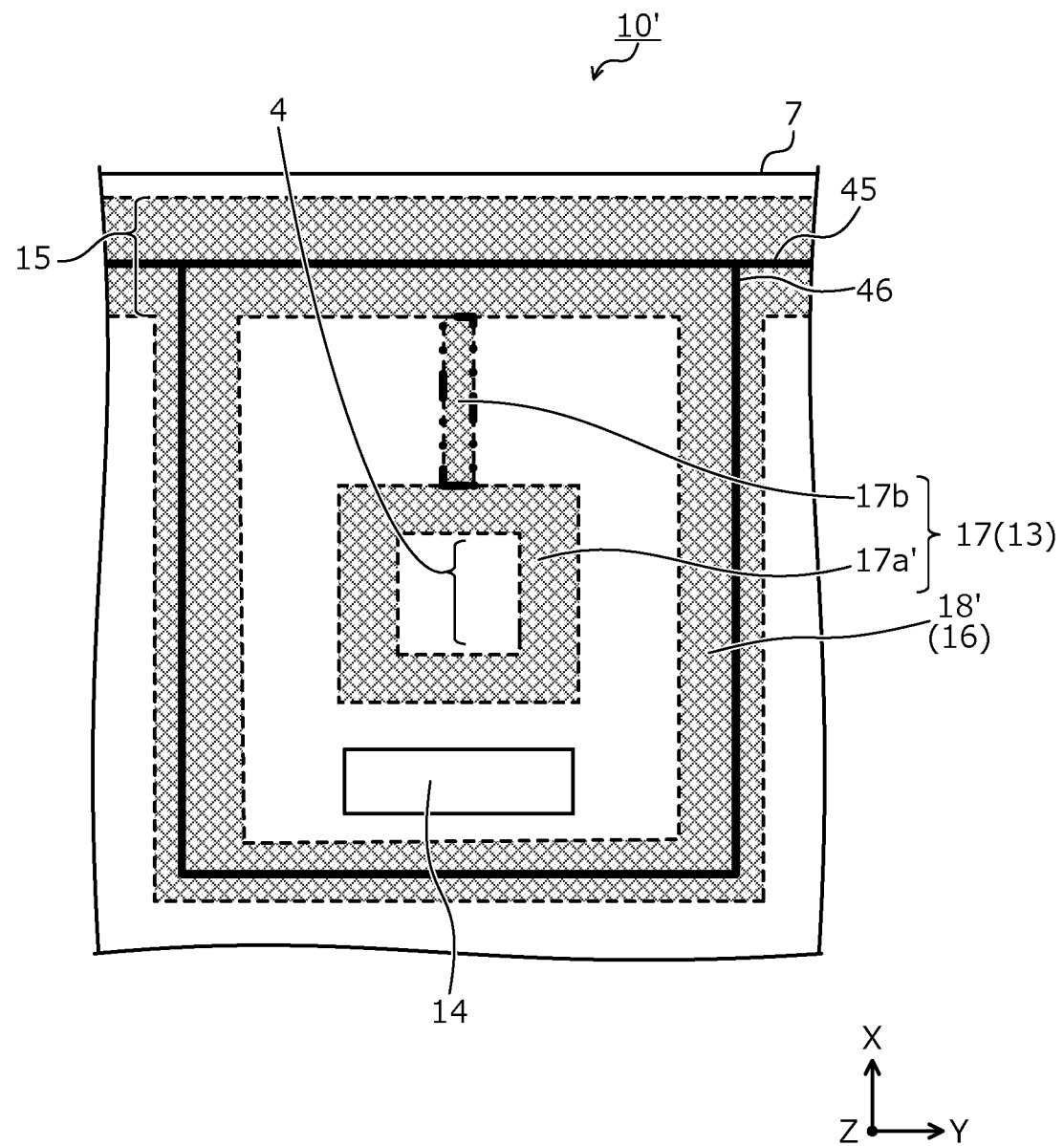
FIG. 11 is a plan view of an example of a layout of a portion of the semiconductor device according to the second embodiment, viewed from the front side of the semiconductor substrate.
Figure 12A:
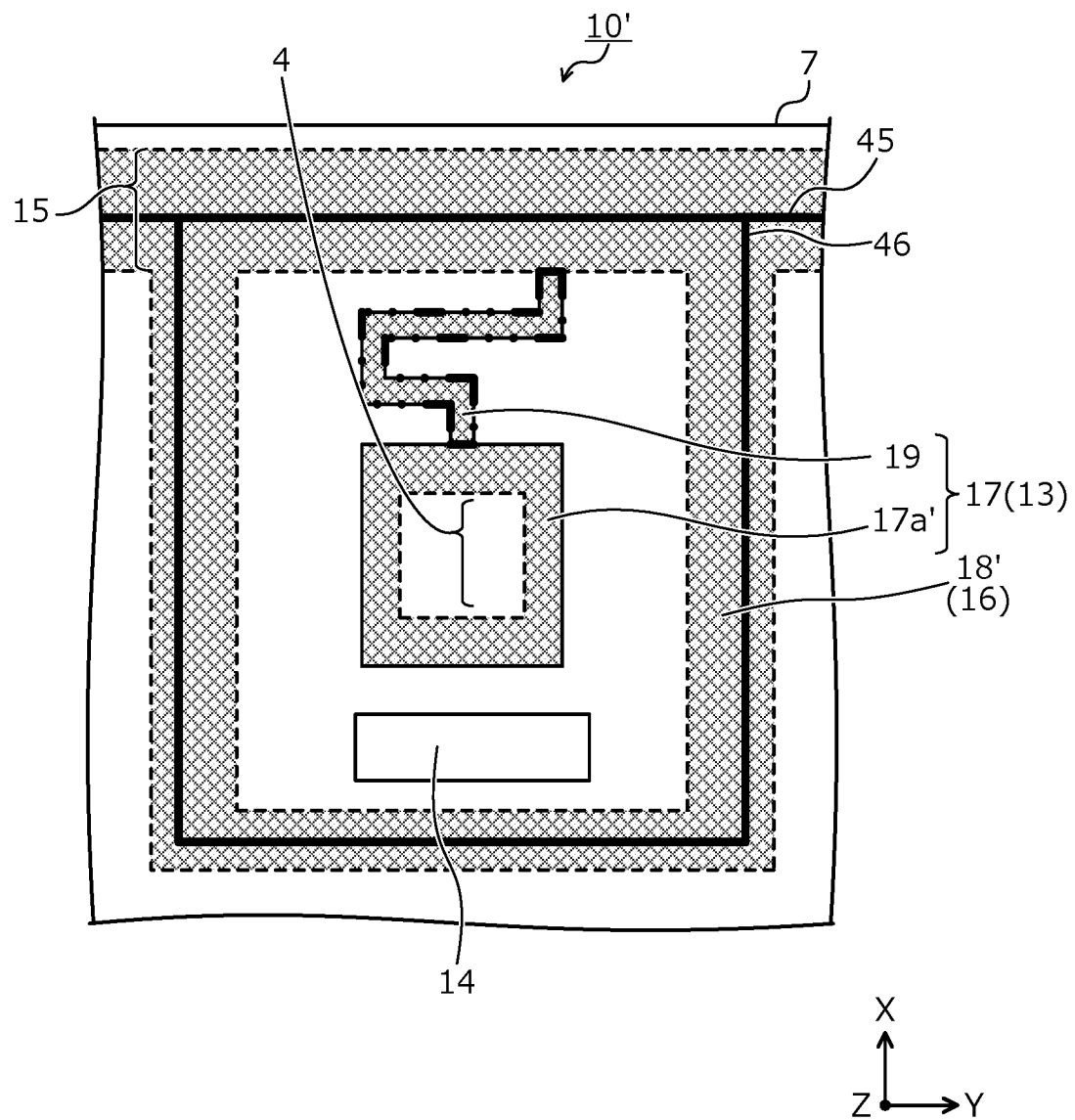
FIG. 12A is a plan view of an example of a layout of a portion of the semiconductor device according to the second embodiment, viewed from the front side of the semiconductor substrate.
Figure 12B:
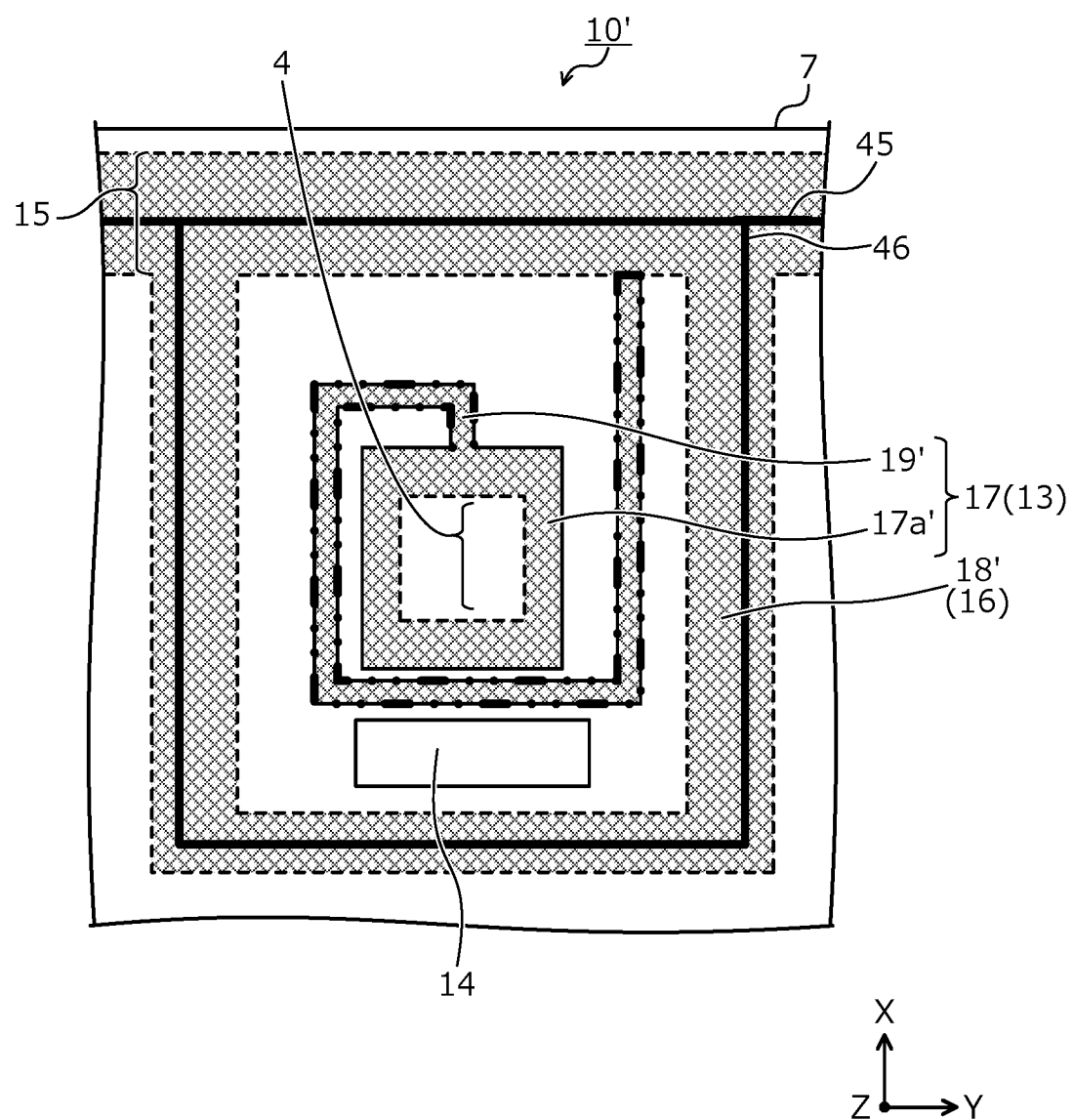
FIG. 12B is a plan view of an example of a layout of a portion of the semiconductor device according to the second embodiment, viewed from the front side of the semiconductor substrate.

An arithmetic area that the sensing capacitance region 18' occupies in the extracting region 5 may be increased by the amount that the arithmetic area that the first portion 17a' of the built-in resistance region 17 occupies is reduced (FIGS. 8, 9, 10A, 10B). Configuration may be such that in the extracting region 5, the sensing capacitance region 18' is not provided and only the extended portion 16 of the gate runner 15 is configured (FIGS. 11, 12A, 12B). In an instance in which the sensing capacitance region 18' is not provided and only the extended portion 16 of the gate runner 15 (hatched portion provided along the contact hole 46) is configured, the sensing polysilicon layer 13 is not present between the semiconductor substrate 7 and the sensing emitter pad 14 that face each other in the depth direction, across the interlayer insulating film and field oxide film intervening therebetween (FIGS. 11, 12A, 12B).

Further, in an instance in which in the extracting region 5, the sensing capacitance region 18' is not provided and only the extended portion 16 of the gate runner 15 is configured, a second portion 19' of the built-in resistance region 17 may have a first end that is connected to the gate runner 15 and that extends so as to substantially go around and surround a periphery of the first portion 17a' of the built-in resistance region 17, and the built-in resistance region 17 may have a second end connected to the first portion 17a' (FIG. 12B). In this instance, the second end of the second portion 19' of the built-in resistance region 17 is preferably connected to the first portion 17a' of the built-in resistance region 17, at a position facing the center of the detecting region 4.

While not depicted, the semiconductor devices 10' according to the second embodiment depicted in FIGS. 10A and 10B may be applied to the semiconductor device 10' according to the second embodiment depicted in FIG. 9, whereby the planar shape is such that the second portion 19 of the built-in resistance region 17 extends meandering from the first portion 17a' of the built-in resistance region 17, to the extended portion 16 of the gate runner 15. The semiconductor device 10' according to the second embodiment depicted in FIG. 11 may be applied to the semiconductor device 10' according to the second embodiment depicted in FIG. 9, whereby the sensing capacitance region 18' is not provided and only the extended portion 16 of the gate runner 15 is configured.

The semiconductor devices 10' according to the second embodiment depicted in FIGS. 10A, 10B, and 11 may be applied to the semiconductor device 10' according to the second embodiment depicted in FIG. 9, whereby the planar shape is such that the second portion 19 of the built-in resistance region 17 extends meandering from the first portion 17a' of the built-in resistance region 17 to the extended portion 16 of the gate runner 15, and the sensing capacitance region 18' is not provided and only the extended portion 16 of the gate runner 15 is configured. In the semiconductor device 10 according to the first embodiment, the sensing capacitance region 18 may be omitted and the extended portion 16 of the gate runner 15 of the semiconductor device 10' according to the second embodiment depicted in FIG. 11 may be disposed.

As described above, according to the second embodiment, when the first portion of the built-in resistance region and the gate runner are electrically connected by the second portion of the built-in resistance region, the built-in resistance region functions as built-in resistance of the sensing IGBT. Therefore, even when the planar shapes of the first and the second portions of the built-in resistance region and the sensing capacitance region are variously changed, effects similar to those of the first embodiment may be obtained.

Figure 13:
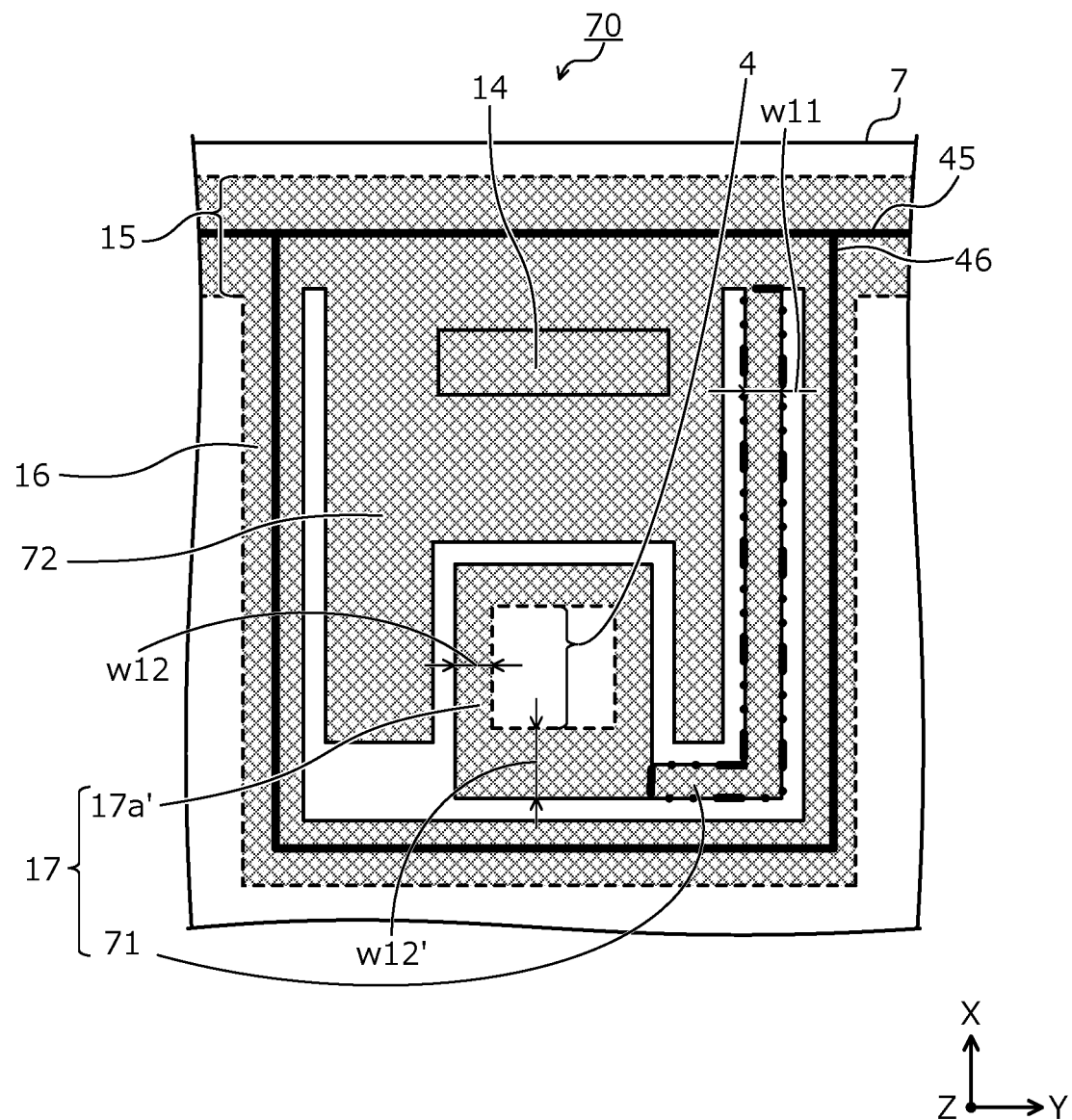
FIG. 13 is a plan view of an example of a layout of a portion of a semiconductor device according to a third embodiment, viewed from a front side of a semiconductor substrate.
Figure 14:
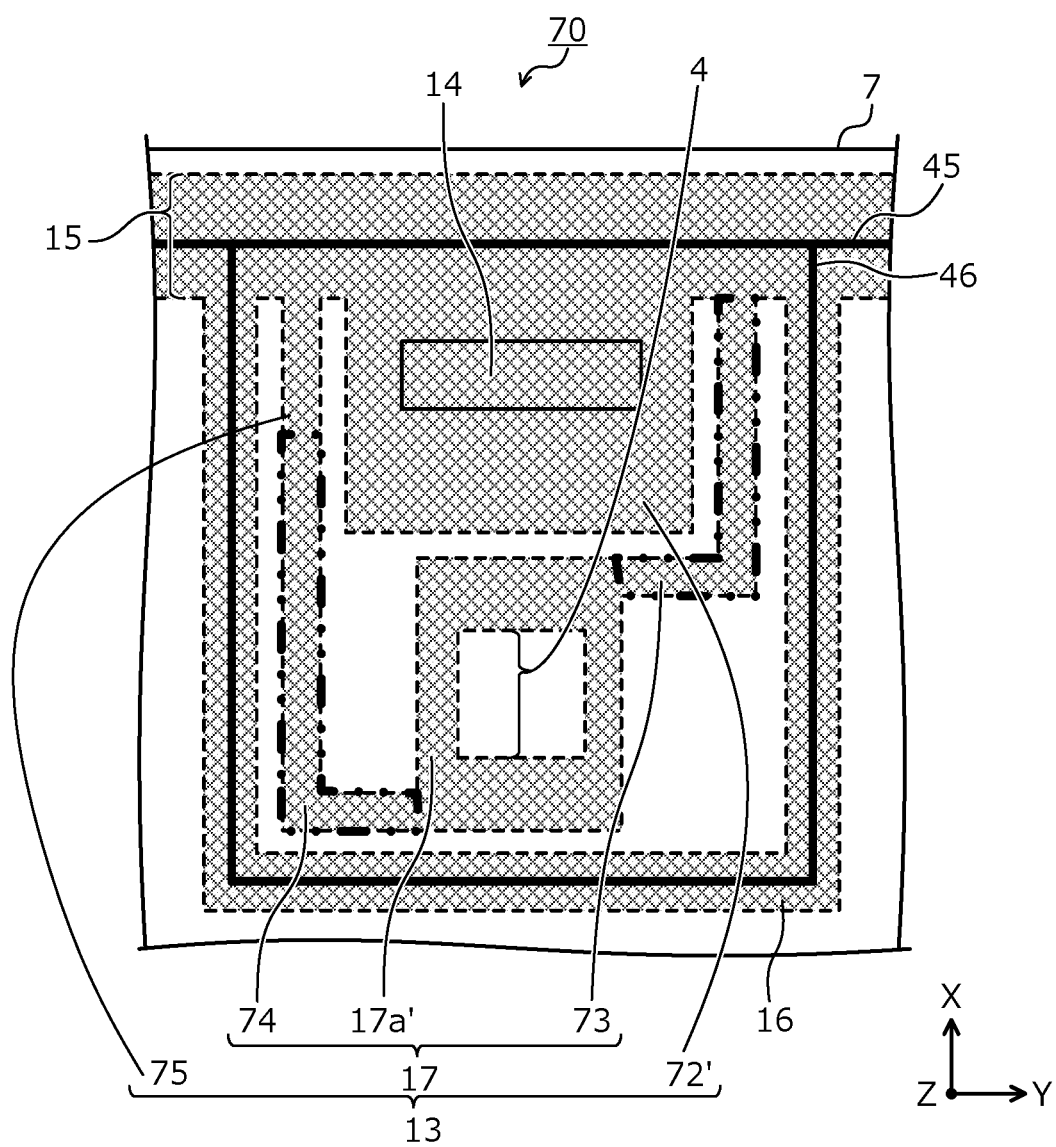
FIG. 14 is a plan view of an example of a layout of a portion of the semiconductor device according to the third embodiment, viewed from the front side of the semiconductor substrate.
Figure 15:
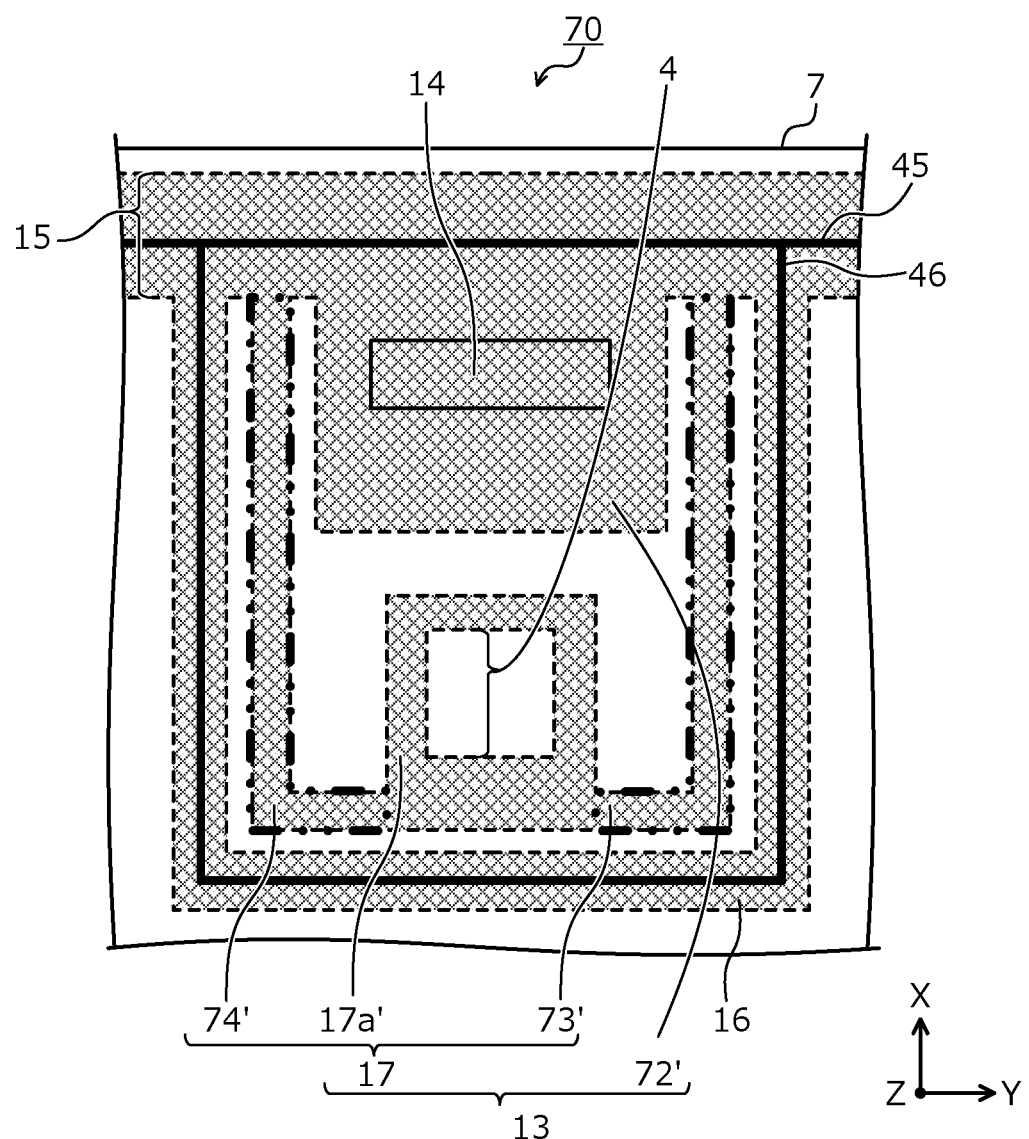
FIG. 15 is a plan view of an example of a layout of a portion of the semiconductor device according to the third embodiment, viewed from the front side of the semiconductor substrate.

Next, a structure of a semiconductor device according to a third embodiment is described. FIGS. 13, 14, and 15 are plan views of examples of layouts of a portion of the semiconductor device according to the third embodiment, viewed from the front side of the semiconductor substrate. A layout of an entire area of a semiconductor device 70 according to the third embodiment, viewed from the front surface of the semiconductor substrate 7 is similar to that of the semiconductor device 10 according to the first embodiment (refer to FIG. 1). In FIGS. 13 to 15, the second cell region 3 in FIG. 1 is enlarged, and the sensing polysilicon layer 13 and the gate runner 15 are indicated by hatching. In FIGS. 13 to 15, ranges of the second portions 71, 73, 74, 73', 74' of the built-in resistance region 17 are surrounded by bold double-dot-dashed lines. Further, in FIGS. 13 to 15, the emitter electrodes 51, 52 are not depicted (refer to FIGS. 1, 4, 5).

The semiconductor device 70 according to the third embodiment differs from the semiconductor device 10' according to the second embodiment depicted in FIG. 8 in that in the extracting region 5, the second portion 71 of the built-in resistance region 17 has a narrow width w11, is extended to be longer, and has a high resistance. In the semiconductor device 70 according to the third embodiment depicted in FIG. 13, a sensing capacitance region 72 is connected to the gate runner 15. The sensing capacitance region 72 is not in contact with the extended portion 16 of the gate runner 15. The sensing capacitance region 72 occupies a majority of the surface area of the extracting region 5.

The detecting region 4 is disposed further apart from the gate runner 15 than is the sensing capacitance region 72, and a periphery thereof is surrounded by the extracting region 5. The first portion 17a' of the built-in resistance region 17, similarly to the second embodiment, is provided along the border between the detecting region 4 and the extracting region 5 and surrounds a periphery of the detecting region 4, in substantially a rectangular shape. A shape of a contour of an outer peripheral edge of the first portion 17a' of the built-in resistance region 17, similarly to the second embodiment, is substantially a rectangular shape that is slightly larger than the detecting region 4.

The first portion 17a' of the built-in resistance region 17 may be provided having a constant width w12 around an entire periphery of the detecting region 4, or may be provided having a different width w12' at a predetermined edge among the edges of the rectangular shape thereof. The second portion 71 of the built-in resistance region 17 has an L-shaped planar shape. For example, the second portion 71 of the built-in resistance region 17 extends from the gate runner 15 and between the sensing capacitance region 72 and the extended portion 16 of the gate runner 15, along two edges of the outer periphery of the second cell region 3, facing the first cell region 2.

A first end of the L-shape of the second portion 71 of the built-in resistance region 17 is connected to the gate runner 15. A second end of the L-shape of the second portion 71 of the built-in resistance region 17 is connected to the first portion 17a' of the built-in resistance region 17. The sensing capacitance region 72 may surround a periphery of the first portion 17a' of the built-in resistance region 17, along three edges of the first portion 17a'. The sensing emitter pad 14 is provided between the first portion 17a' of the built-in resistance region 17 and the gate runner 15. The sensing emitter pad 14 faces the sensing capacitance region 72, across interlayer insulating film.

The semiconductor devices 70 according to the third embodiment depicted in FIGS. 14 and 15 differ from the semiconductor device 70 according to the third embodiment depicted in FIG. 13 in that in the extracting region 5, two of the second portions of the built-in resistance region 17, having an L-shaped planar shape are provided. A combined resistance of the two second portions of the built-in resistance region 17 functions as built-in resistance of the sensing IGBT 30. The two second portions of the built-in resistance region 17, for example, are disposed as follows.

As depicted in FIG. 14, the first second-portion 73 of the built-in resistance region 17 extends from the gate runner 15 and between the sensing capacitance region 72' and the extended portion 16 of the gate runner 15, along two edges of the periphery of the second cell region 3, facing the first cell region 2. A first end of the L-shape of the first second-portion 73 of the built-in resistance region 17 is connected to the gate runner 15. A second end of the L-shape of the first second-portion 73 of the built-in resistance region 17 is connected to the first portion 17a' of the built-in resistance region 17, connected to a side thereof close to the gate runner 15.

A second second-portion 74 of the built-in resistance region 17 is disposed at a position to face the first second-portion 73 of the built-in resistance region 17, across the sensing capacitance region 72'. The second second-portion 74 of the built-in resistance region 17 extends between the sensing capacitance region 72' and the extended portion 16 of the gate runner 15 from a direction of the gate runner 15, and of the three edges of the periphery of the second cell region 3 facing the first cell region 2, the second second-portion 74 extends along one edge where the first second-portion 73 is not disposed and is connected to the one edge.

A first end of the L-shape of the second second-portion 74 of the built-in resistance region 17 is connected to the gate runner 15 via a portion 75 of the sensing polysilicon layer 13. A second end of the L-shape of the second second-portion 74 of the built-in resistance region 17 is connected to the first portion 17a' of the built-in resistance region 17, connected to a side thereof close to the extended portion 16 of the gate runner 15. The sensing capacitance region 72', for example, has a substantially rectangular planar shape.

As depicted in FIG. 15, the second ends of L-shape of the second portions 73', 74' of the built-in resistance region 17 may both extend between the first portion 17a' of the built-in resistance region 17 and the sensing capacitance region 72'. In this instance, for example, the first ends of the L-shape of the second portions 73', 74' of the built-in resistance region 17 are connected to respectively different parts of the gate runner 15. The first- and the second-second ends of the L-shape of the second portions 73', 74' of the built-in resistance region 17 are both connected to the first portion 17a' of the built-in resistance region 17.

As described above, according to the third embodiment, effects similar to those of the first and the second embodiments may be obtained. Further, according to the third embodiment, in the extracting region, the second portion of the built-in resistance region has a narrow width and is extended to be longer, whereby the built-in resistance of the sensing IGBT may be set to a high resistance.

Next, a structure of a semiconductor device according to a fourth embodiment is described. FIGS. 16 and 17 are plan views of layouts of a portion of the semiconductor device according to the fourth embodiment, viewed from the front side of the semiconductor substrate. A layout of an entire area of a semiconductor device 80 according to the fourth embodiment, viewed from the front surface of the semiconductor substrate 7 is similar to that of the semiconductor device 10 according to the first embodiment (refer to FIG. 1). FIGS. 16 and 17 are enlarged plan views near the gate pad 12 of the main IGBT in FIG. 1. FIGS. 16 and 17 depict a same region in FIG. 1, however, hatched regions therein differ. In FIG. 16, the emitter electrode 51 and the gate pad metal 55 (refer to FIG. 17) are not depicted.

In FIG. 16, a polysilicon layer 83 and the gate runner 15 are indicated by hatching. In FIG. 17, the gate runner metal 53, the extended portion 54' of the gate runner metal 53, and the gate pad metal 55 are indicated by hatching. In FIG. 16, a range of a second portion 81b of a built-in resistance region 81 is surrounded by a bold double-dot-dashed line. In FIGS. 16 and 17, contact holes formed in the interlayer insulating film 44 including the contact holes 45 of the gate runner metal 53 and the gate runner 15, the contact hole 46' of the extended portion 54' of the gate runner metal 53 and the extended portion 16' of the gate runner 15, and a contact hole 45' of the gate pad metal 55 and the polysilicon layer 83 are indicated by bold lines.

The semiconductor device 80 according to the fourth embodiment differs from the semiconductor device 10 according to the first embodiment in that in a region (third region) in which the gate pad 12 is disposed, polysilicon layer 83 is disposed. An equivalent circuit diagram of the semiconductor device 80 according to the fourth embodiment corresponds to a portion surrounded by a rectangle indicated by reference character 91a in FIG. 18. The polysilicon layer 83 is provided on the front surface of the semiconductor substrate 7 via the field oxide film 43b. The polysilicon layer 83 has the built-in resistance region 81 and the extended portion 16' of the gate runner 15. The built-in resistance region 81 is a connector region that electrically connects the gate pad metal 55 and the gate runner 15 that are disposed apart from each other.

In the semiconductor device 80 according to the fourth embodiment, the built-in resistance region 81 is in a state of being connected to the gate electrodes 28 of the main IGBT 20 via the gate runner 15. The built-in resistance region 81 has a first portion (third gate electrode layer portion) 81a electrically connected to the gate pad 12 and a second portion (fourth gate electrode layer portion) 81b electrically connecting the first portion 81a to the gate runner 15. The first portion 81a of the built-in resistance region 81 faces an entire area of the gate pad 12, across the interlayer insulating film 44. The gate pad 12 is configured by a portion of the gate pad metal 55 exposed in an opening of the passivation film 47. The gate pad metal 55 is provided on the polysilicon layer 83 via the interlayer insulating film 44.

The first portion 81a of the built-in resistance region 81 suffices to face an entire area of the gate pad 12, across the interlayer insulating film 44 and a shape of a contour of an outer peripheral edge of the first portion 81a of the built-in resistance region 81 suffices to be a substantially rectangular shape that is at least slightly larger than the gate pad 12. The second portion 81b of the built-in resistance region 81 connects the first portion 81a of the built-in resistance region 81 and the extended portion 16' of the gate runner 15. In the semiconductor device 80 according to the fourth embodiment, similarly to the second embodiment, a resistance value of the first portion 81a of the built-in resistance region 81 is smaller than a resistance value of the second portion 81b, and the second portion 81b of the built-in resistance region 81 mainly functions as built-in resistance of the sensing IGBT 30.

The second portion 81b of the built-in resistance region 81, for example, is positioned between the first portion 81a of the built-in resistance region 81 and the extended portion 16' of the gate runner 15, and has a linear planar shape extending from the first portion 81a of the built-in resistance region 81 to the extended portion 16' of the gate runner 15. While not depicted, the second portion 81b of the built-in resistance region 81, for example, may be positioned between the first portion 81a of the built-in resistance region 81 and the gate runner 15, and may connect the first portion 81a of the built-in resistance region 81 and the gate runner 15.

The extended portion 16' of the gate runner 15 has a substantially U-shaped planar shape, and ends of the U-shape are connected to respectively different parts of the gate runner 15. The gate runner 15 and the extended portion 16' of the gate runner 15 form a substantially rectangular planar shape surrounding a periphery of the built-in resistance region 81.

The semiconductor device 80 according to the fourth embodiment may be applied to the semiconductor devices 10, 10', 70 according to the first to the third embodiments, and in both the second cell region 3 and a region in which the gate pad 12 is disposed, the built-in resistance regions 17, 81 may be disposed, respectively.

As described above, according to the fourth embodiment, even when the gate pad and the gate runner are connected by the built-in resistance region, effects similar to those of the first to third embodiments may be obtained. Further, according to the fourth embodiment, while the built-in resistance region is added to the region in which the gate pad is disposed, thereby forming a configuration in which gate resistance is connected to the sensing IGBT, a configuration is formed in which gate resistance is connected to the main IGBT as well. As a result, a Miller period of the gate voltage of the main IGBT increases and switching loss degrades. Therefore, adding the built-in resistance region between the gate runner of the sensing IGBT and the detecting region may prevent the switching loss from degrading.

Figure 19:
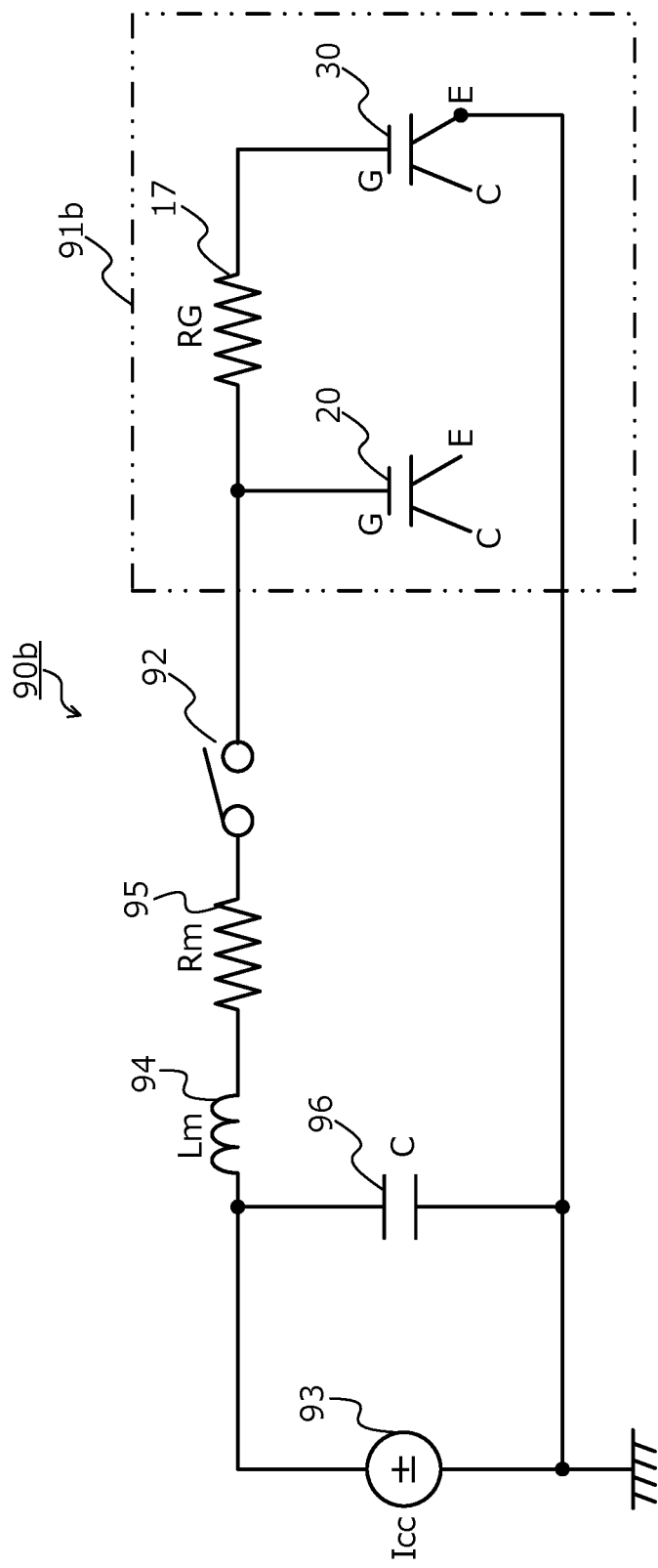
FIG. 19 is a circuit diagram of a machine model of an ESD evaluation device for evaluating ESD tolerance of the sensing IGBT.
Figure 20:
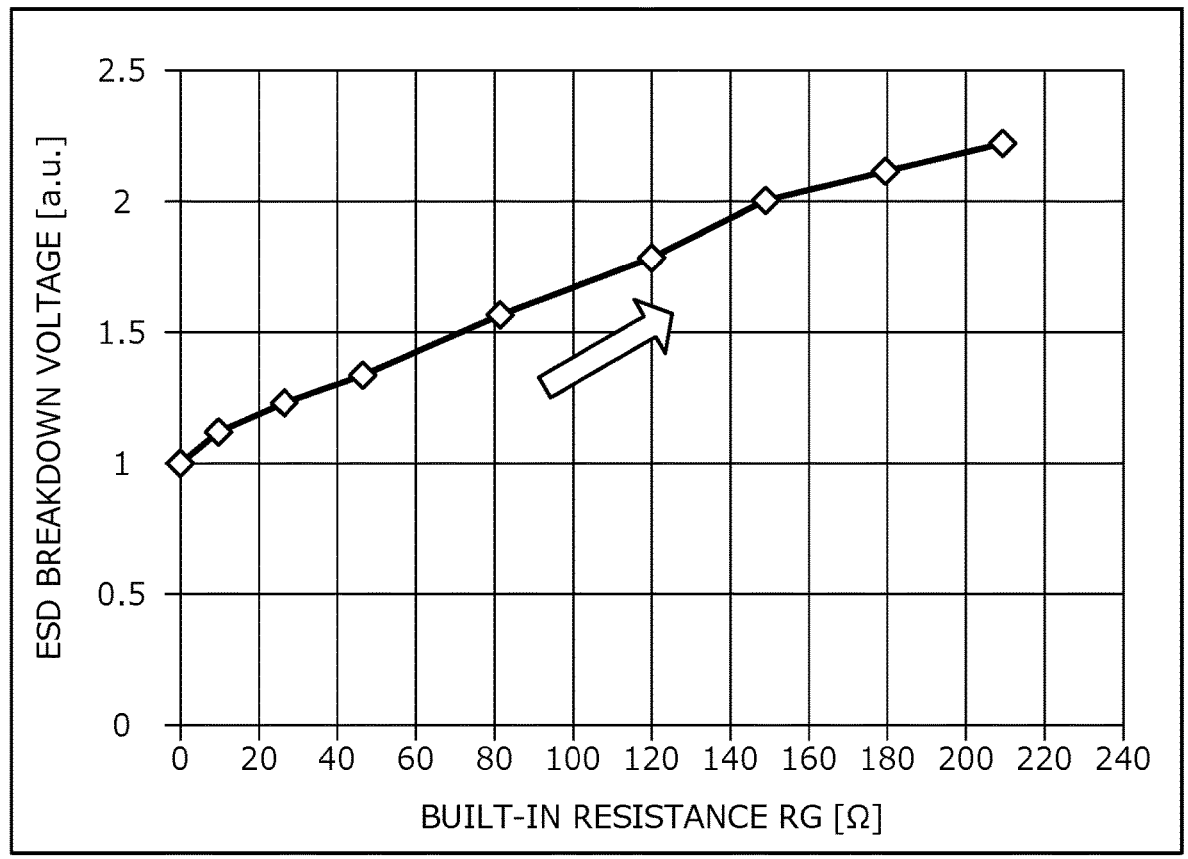
FIG. 20 is a characteristics diagram showing a relationship between resistance values of a sensing resistor of a first example and ESD tolerance of the sensing IGBT.
Figure 21:
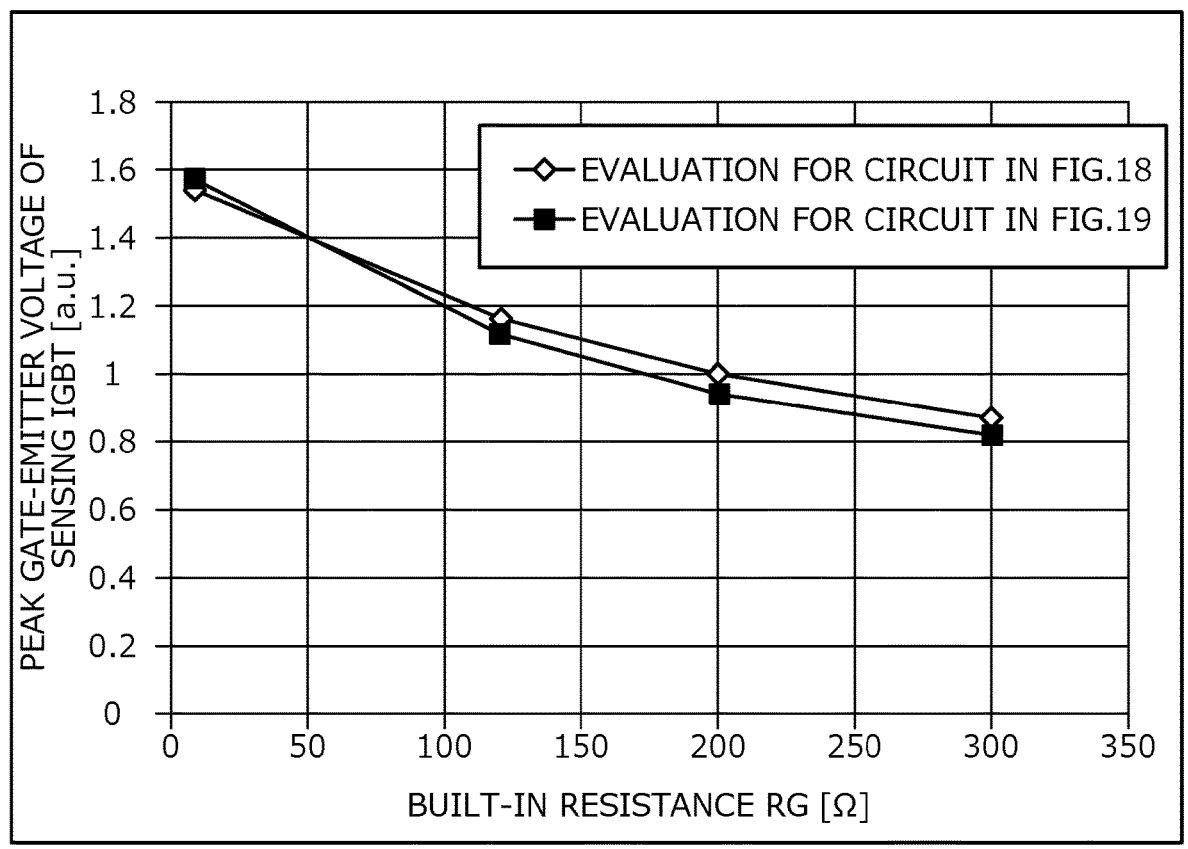
FIG. 21 is a characteristics diagram showing a relationship between resistance values of a sensing resistor of the first example and ESD tolerance of the sensing IGBT.

ESD tolerance of the sensing IGBT 30 was verified. FIGS. 18 and 19 are circuit diagrams of machine models of ESD evaluation devices for evaluating ESD tolerance of the sensing IGBT. FIGS. 20 and 21 are characteristics diagrams showing a relationship between resistance values of a sensing resistor of the first example and ESD tolerance of the sensing IGBT. In FIGS. 20 and 21, measurements are obtained using ESD evaluation circuits 90a, 90b depicted in FIGS. 18, 19, respectively.

A semiconductor device 91a depicted in FIG. 18 corresponds to the semiconductor device 80 according to the fourth embodiment (refer to FIGS. 16, 17) and includes the main IGBT 20 and the sensing IGBT 30 connected in parallel, and the built-in resistance RG connected between a switch 92 and gates of the main IGBT 20. The built-in resistance RG of the semiconductor device 91a corresponds to the second portion 81b of the built-in resistance region 81.

When the switch 92 of the ESD evaluation circuit 90a depicted in FIG. 18 is turned ON, charge charged in a capacitor 96 until voltage is constant is supplied to the main IGBT 20 and the sensing IGBT 30 (this voltage that has become constant, hereinafter, is referred to as ESD applied voltage). Further, while the emitter of the sensing IGBT 30 is grounded, emitter of the main IGBT 20 is not grounded and therefore, charge is supplied only between the gate and emitter of the sensing IGBT 30.

A positive electrode of the current source 93 is connected to the switch 92 and a negative electrode is grounded. Wiring inductance 94 assuming inductance Lm of device wiring and a resistance load 95 assuming resistance Rm of the wiring are connected in series between the positive electrode of the current source 93 and the switch 92. The capacitor 96 assuming parasitic capacitance due to wiring, etc. between the positive electrode and the negative electrode of the current source 93 is connected between the positive electrode of the current source 93 and the wiring inductance 94.

The ESD evaluation circuit 90b depicted in FIG. 19 differs from the ESD evaluation circuit 90a depicted in FIG. 18 in that the built-in resistance RG is connected between the gates of the main IGBT 20 and the gates of the sensing IGBT 30. A semiconductor device 91b in FIG. 19 corresponds to the semiconductor device 10 according to the first embodiment (refer to FIGS. 2 to 5), and includes the main IGBT 20 and the sensing IGBT 30 connected in parallel, and the built-in resistance RG connected between the gates of the main IGBT 20 and the gates of the sensing IGBT 30. The built-in resistance RG of the semiconductor device 91b corresponds to the second portion 17b of the built-in resistance region 17.

Charge charged in the capacitor 96 of the ESD evaluation circuit 90b depicted in FIG. 19 is charged in the gates of the sensing IGBT 30, via the built-in resistance RG for sensing, when the switch 92 turns ON. When the voltage at this time has a voltage value exceeding the gate insulation withstand voltage of the sensing IGBT 30, dielectric breakdown of the gate insulating films 37 occurs.

A relationship between the resistance value of the built-in resistance RG of the sensing IGBT 30 and ESD tolerance when the resistance value of the built-in resistance RG of the semiconductor device 91a is variously changed using the ESD evaluation circuit 90a depicted in FIG. 18 (hereinafter, the first example) is shown in FIG. 20. Results of simulation of a relationship between the resistance value of the built-in resistance RG of the sensing IGBT 30 of the semiconductor devices 91a, 91b, respectively, and peak voltage between the gates and emitter of the sensing IGBT 30, using the ESD evaluation circuits 90a, 90b depicted in FIGS. 18 and 19 are shown in FIG. 21.

From the results shown in FIG. 20, it was confirmed that the higher is the resistance value of the built-in resistance RG, the higher the ESD tolerance of the sensing IGBT 30 may be set. A direction of an arrow in FIG. 20 indicates a direction in which the ESD tolerance of the sensing IGBT 30 increases. Further, from the results shown in FIG. 20, it was confirmed that the ESD breakdown voltage of the sensing IGBT 30 increases proportionately to the magnitude of the resistance value of the built-in resistance RG. From the results shown in FIG. 21, it was confirmed that the higher is the resistance value of the built-in resistance RG, the lower the peak voltage between the gates and emitter of the sensing IGBT 30 may be set. It was found that with either of the ESD evaluation circuits 90a, 90b in FIGS. 18 and 19, substantially the same results are obtained.

In FIGS. 20 and 21, horizontal axes indicate resistance values [Ω] of the built-in resistance RG. In FIG. 20, a vertical axis indicates, in an arbitrary unit (a.u.), ESD applied voltage (hereinafter, ESD breakdown voltage) supplied to the sensing IGBT 30 during dielectric breakdown of the gate insulating films 3. In FIG. 21, a vertical axis indicates, in an arbitrary unit, the peak voltage between the gates and emitter of the sensing IGBT 30.

Figure 22:
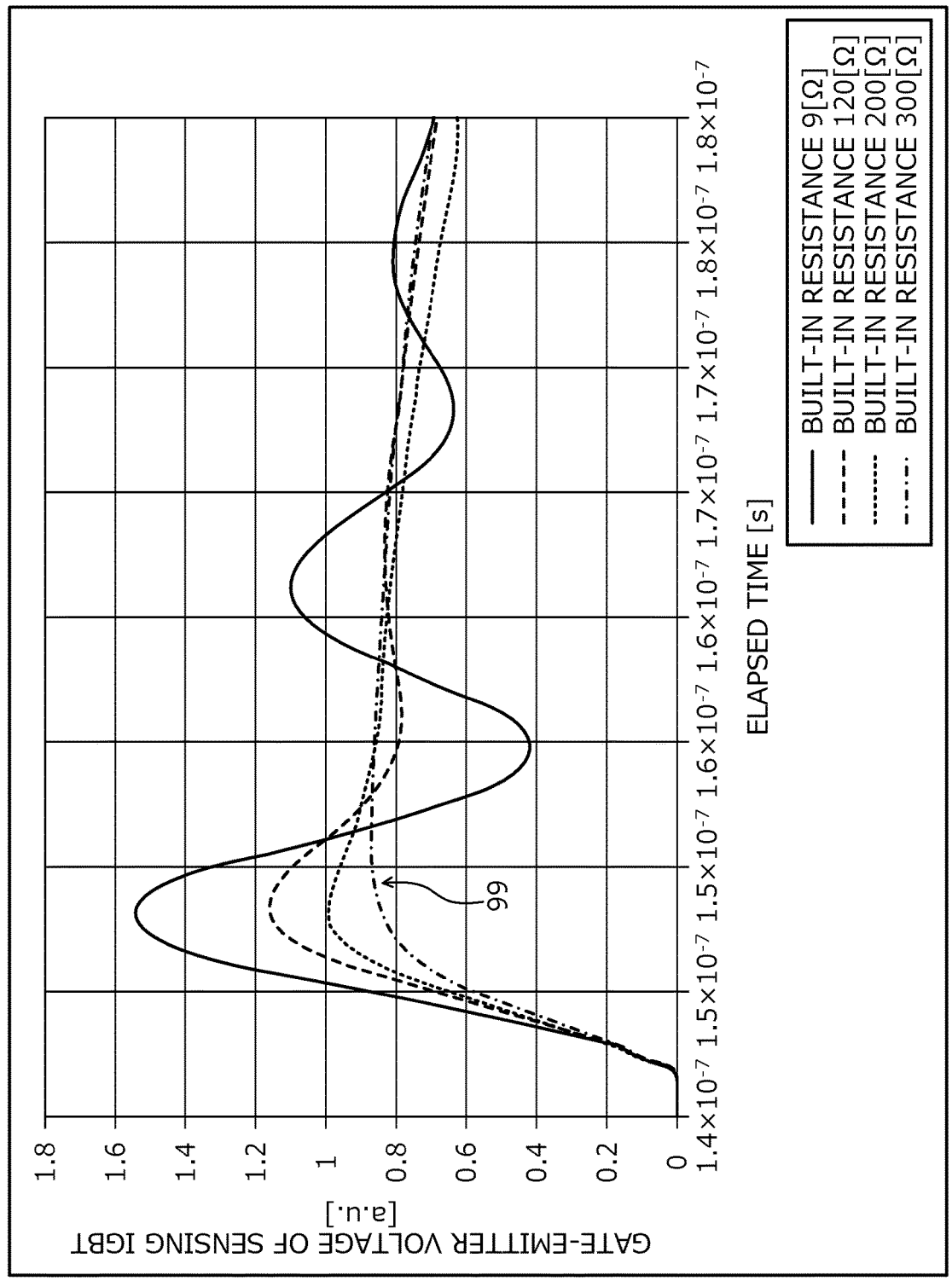
FIG. 22 is a diagram showing results of simulation of ESD waveforms of a sensing IGBT of a second example.

Next, a relationship between ESD applied voltage to the sensing IGBT 30 and the resistance value of the built-in resistance RG was verified. Results of simulation of ESD waveforms generated by the gates of the sensing IGBT 30 when the resistance value of the built-in resistance RG of the semiconductor device 91b is variously changed using the ESD evaluation circuit 90b depicted in FIG. 19 described above (hereinafter, second example) are shown in FIG. 22. FIG. 22 is a diagram showing results of simulation of ESD waveforms of the sensing IGBT of the second example. In FIG. 22, a horizontal axis indicates elapsed time [seconds (s)] and a vertical axis indicates, in an arbitrary unit, gate-emitter voltage of the sensing IGBT 30. ESD waveforms generated by gates of a conventional example (refer to FIGS. 28 to 31) are not depicted. The conventional example differs from the second example in that the conventional example does not have the built-in resistance RG (the second portion 81b of the built-in resistance region 81) of the present invention.

In the conventional example, the voltage applied to the gates of the sensing IGBT 130 oscillated, and the ESD applied voltage occurring due to the voltage of the first pulse (corresponds to point indicated by reference numeral 99 in FIG. 22) was high. Therefore, when the resistance value exceeded the gate insulation withstand voltage of the sensing IGBT 130, dielectric breakdown of the gate insulating films 37 of the sensing IGBT 130 was confirmed. On the other hand, from the results shown in FIG. 22, in the second example, while the voltage applied to the gates of the sensing IGBT 30 oscillated, it was confirmed that, compared to the conventional example, the voltage value of the first pulse was reduced. In addition, it was found that the voltage value of the first pulse could be reduced the higher the resistance value of the built-in resistance RG containing polysilicon was set. It is conceivable that when this first pulse voltage peak is small, dielectric breakdown of the gate insulating films 37 does not easily occur and the ESD tolerance is enhanced.

Meanwhile, from the results in FIG. 21, the ESD evaluation circuit 90a of the semiconductor device 91a and the ESD evaluation circuit 90b of the semiconductor device 91b have the same first pulse voltage peak and therefore, in the semiconductor device 91a and the semiconductor device 91b, it is conceivable that the same effect could be obtained for the ESD tolerance. When the built-in resistance RG is added to the semiconductor device 91a, while gate resistance of the main IGBT 20 and the sensing IGBT 30 increases, the gate-emitter capacitance CGE of the main IGBT 20 is large and therefore, the Miller period of switching increases and switching loss degrades.

On the other hand, when the built-in resistance RG is added to the semiconductor device 91b, while the gate resistance of the sensing IGBT 30 alone increases, in the sensing IGBT 30, the gate-emitter capacitance CGE with respect to the main IGBT 20 is small at ¹⁄₁₀₀₀ and therefore, the Miller period of the switching in the sensing IGBT 30 is extremely small. Thus, even when the built-in resistance RG is added to the semiconductor device 91b, increase of the Miller period is reduced, enabling degradation of the switching loss to be reduced. Accordingly, assuming low switching loss, addition of the built-in resistance RG to the semiconductor device 91b is desirable.

The resistance value of the built-in resistance RG may be set in a range from 10Ω to 5000Ω. Reasons for this include the following two reasons. A first reason is that when the resistance value of the built-in resistance RG containing polysilicon is high, heat concentrates at the built-in resistance RG due to current flowing in the built-in resistance RG and destruction easily occurs. In contrast to the occurrence of destruction in the detecting region 104 of the conventional example, in the present invention, as described above, thermal destruction occurs at the built-in resistance RG due to heat concentrating at the built-in resistance RG and therefore, the ESD tolerance (corresponds to the ESD breakdown voltage on the vertical axis in FIG. 20) decreases. A second reason is that when the built-in resistance RG exceeds 5000Ω, the Miller period of the gate voltage of the sensing IGBT 30 increases and the switching loss degrades. Therefore, when the resistance value of the built-in resistance RG is at most 5000Ω, the effects of both thermal destruction and switching loss may be reduced.

Figure 23:
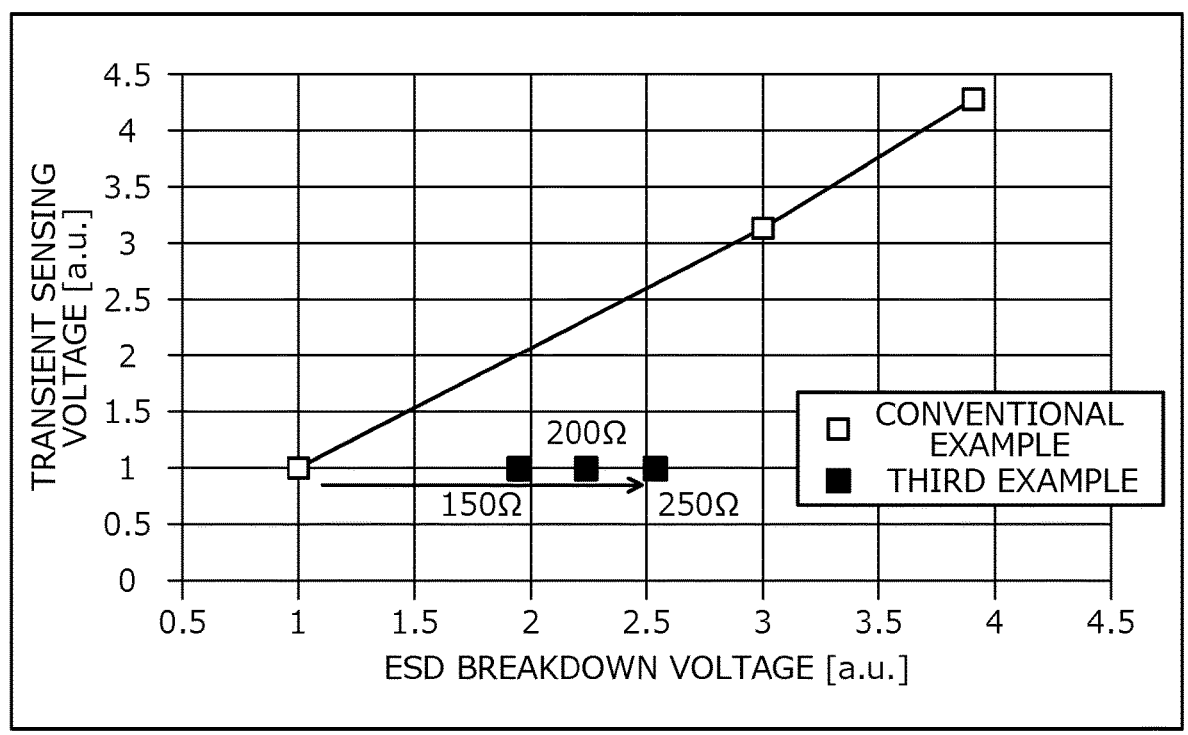
FIG. 23 is a diagram showing results of simulation of a relationship between ESD tolerance of a sensing IGBT and transient sensing voltage of a third example.

Next, a relationship between the ESD tolerance of the sensing IGBT 30 and transient sensing voltage (the sensing voltage VSC applied to the sensing resistor 161, refer to FIG. 24) was verified. Results of simulation of a relationship between the resistance value (150Ω, 200Ω, 250Ω) of the built-in resistance RG of the semiconductor device 91a, the ESD tolerance of the sensing IGBT 30, and the transient sensing voltage, using the ESD evaluation circuit 90a depicted in FIG. 18 described above (hereinafter, third example) are shown in FIG. 23. Further, in FIG. 23, results of simulation of a relationship between the ESD tolerance of the sensing IGBT 130 and the transient sensing voltage of the conventional example, using the switching circuit depicted in FIG. 24, are shown. FIG. 23 is a diagram showing results of simulation of a relationship between the ESD tolerance of the sensing IGBT and the transient sensing voltage of the third example. In FIG. 23, a horizontal axis and a vertical axis both show results in arbitrary units.

From the results shown in FIG. 23, in the conventional example, when capacitance between the gates and emitter is increased in the sensing IGBT 130, the ESD tolerance increases, however, the transient sensing voltage also increases. In contrast, in the third example, the built-in resistance RG is included, whereby as compared to the conventional example under the same conditions except that the built-in resistance RG is not included, the ESD tolerance alone could be enhanced while the transient sensing voltage was maintained. Further, in the third example, it was confirmed that as the built-in resistance RG of the sensing IGBT 30 is increased, the ESD tolerance alone was enhanced while the transient sensing voltage was maintained. Therefore, addition of the built-in resistance RG enables improvement of the trade-off between the transient sensing voltage and ESD tolerance.

In the foregoing, without limitation to the embodiments described above, the present invention may be variously modified within a range not departing from the spirit of the invention. Furthermore, the present invention is similarly implemented when conductivity types (n-type, p-type) are reversed.

According to the invention described above, voltage input to gates of the second insulated-gate-type bipolar transistor is divided by the second gate electrode layer portion and becomes smaller. As a result, voltage values of pulses of ESD waveforms do not easily exceed the gate insulation withstand voltage of the second insulated-gate-type bipolar transistor and dielectric breakdown of the gate insulating films of the sensing IGBT does not easily occur. Further, according to the invention described above, the second gate electrode layer portion does not become second gate-emitter capacitance of the insulated-gate-type bipolar transistor, thereby enabling the transient sensing voltage to be suppressed to be low.

The semiconductor device according to the present invention achieves an effect in that the trade-off relationship between enhancing ESD tolerance of the current sensing region and reducing transient sensing voltage may be improved.

As described above, the semiconductor device according to the present invention is useful for semiconductor devices that have, on a single semiconductor substrate having a main IGBT, a sensing IGBT that detects overcurrent flowing in the main IGBT, and is particularly suitable for IPMs having a built-in control IC.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate;
   an active region provided on the semiconductor substrate; and
   a termination region provided in the semiconductor substrate, surrounding a periphery of the active region, wherein
   the active region includes:
      a first cell region in which a first insulated-gate-type bipolar transistor is disposed, and
      a second cell region disposed adjacent to the first cell region, wherein
   the second cell region includes:
      a first region in which a second insulated-gate-type bipolar transistor is disposed, the second insulated-gate-type bipolar transistor having an arithmetic area smaller than that of the first insulated-gate-type bipolar transistor, and
      a second region separating the first cell region from the first region,
   wherein
   the second region includes:
      a first gate electrode layer provided on the semiconductor substrate via an oxide film and having a built-in resistance, and
      an emitter electrode of the second insulated-gate-type bipolar transistor, provided on the first gate electrode layer via an interlayer insulating film,
   wherein
   the termination region comprises a gate runner provided on the semiconductor substrate via the oxide film, the gate runner surrounding a periphery of the active region, and being electrically connected to a plurality of first gate electrodes of the first insulated-gate-type bipolar transistor, wherein
   the first gate electrode layer has:
      a first gate electrode layer portion electrically connected to a plurality of second gate electrodes of the second insulated-gate-type bipolar transistor, and
      a second gate electrode layer portion in the second region, having a planar shape in a plane parallel to a surface of the semiconductor substrate and extending from the first gate electrode layer portion to the gate runner, the second gate electrode layer portion electrically connecting the first gate electrode layer portion and the gate runner, and wherein
   the built-in resistance consists of the first gate electrode layer portion and the second gate electrode layer portion, the second gate electrode layer portion having a resistance in a range from $10\Omega$ to $5000\Omega$.

2. The semiconductor device according to claim 1, wherein
   the second gate electrode layer portion, in the plane parallel to the surface of the semiconductor substrate, linearly extends from the first gate electrode layer portion to the gate runner, to connect the first gate electrode layer portion and the gate runner.

3. The semiconductor device according to claim 1, wherein
   the second gate electrode layer portion, in the plane parallel to the surface of the semiconductor substrate, meanders and extends from the first gate electrode layer portion to the gate runner, to connect the first gate electrode layer portion and the gate runner.

4. The semiconductor device according to claim 1, wherein
   the second gate electrode layer portion, in the plane parallel to the surface of the semiconductor substrate, extends in an L-shape along an outer periphery of the second region, from the first gate electrode layer portion to the gate runner, to connect the first gate electrode layer portion and the gate runner.

5. The semiconductor device according to claim 1, wherein
   the second gate electrode layer portion includes two second gate electrode layer portions between the first gate electrode layer portion and the gate runner, connected in parallel.

6. The semiconductor device according to claim 1, wherein the gate runner has an extended portion extending in the active region, along an outer periphery of the second region and surrounding a periphery of the first region, and wherein the second gate electrode layer portion, in the plane parallel to the surface of the semiconductor substrate, extends from the first gate electrode layer portion to the extended portion of the gate runner, to connect the first gate electrode layer portion and the extended portion of the gate runner.

7. The semiconductor device according to claim 1, further comprising:

in the active region, a third region that is a portion excluding the first cell region and the second cell region, and that is disposed adjacent to the termination region;

in the third region, a second gate electrode layer provided on the semiconductor substrate via the oxide film; and a gate pad provided on the second gate electrode layer via the interlayer insulating film, wherein the second gate electrode layer has:

a third gate electrode layer portion facing the gate pad, across the interlayer insulating film in a direction orthogonal to the surface of the semiconductor substrate, and a fourth gate electrode layer portion in the third region, having a planar shape in a plane parallel to the surface of the semiconductor substrate, and extending from the third gate electrode layer portion to the gate runner, the fourth gate electrode layer portion electrically connecting the third gate electrode layer portion and the gate runner.

8. The semiconductor device according to claim 1, wherein the first insulated-gate-type bipolar transistor has a trench gate structure having the first gate electrodes extending in a depth direction of the semiconductor substrate.

9. The semiconductor device according to claim 1, wherein the first gate electrode layer portion and the second gate electrode layer portion are connected in series.

10. The semiconductor device according to claim 1, wherein a total resistance of the built-in resistance is not less than 150Ω.

* * * * *